United States Patent
Aktas et al.

(10) Patent No.: US 12,362,296 B2
(45) Date of Patent: Jul. 15, 2025

(54) SYSTEMS FOR FABRICATION OF MMIC AND RF DEVICES ON ENGINEERED SUBSTRATES

(71) Applicant: Qromis, Inc., Santa Clara, CA (US)

(72) Inventors: Ozgur Aktas, Pleasanton, CA (US); Vladimir Odnoblyudov, Danville, CA (US); Cem Basceri, Los Gatos, CA (US)

(73) Assignee: Qromis, Inc., Santa Clara, CA (US)

( * ) Notice: Subject to any disclaimer, the term of this patent is extended or adjusted under 35 U.S.C. 154(b) by 494 days.

(21) Appl. No.: 17/501,603

(22) Filed: Oct. 14, 2021

(65) Prior Publication Data

US 2022/0115340 A1     Apr. 14, 2022

Related U.S. Application Data

(60) Provisional application No. 63/091,777, filed on Oct. 14, 2020.

(51) Int. Cl.

| | | |
|---|---|---|
| H01L 23/66 | (2006.01) | |
| H01L 21/48 | (2006.01) | |
| H01L 21/78 | (2006.01) | |
| H01L 23/367 | (2006.01) | |
| H01L 23/528 | (2006.01) | |
| H10D 62/85 | (2025.01) | |
| H10D 84/01 | (2025.01) | |
| H10D 84/05 | (2025.01) | |

(52) U.S. Cl.
CPC .......... *H01L 23/66* (2013.01); *H01L 21/4871* (2013.01); *H01L 21/7806* (2013.01); *H01L 23/367* (2013.01); *H01L 23/5286* (2013.01); *H10D 62/8503* (2025.01); *H10D 84/01* (2025.01); *H10D 84/05* (2025.01); *H01L 2223/6683* (2013.01)

(58) Field of Classification Search
CPC ... H01L 23/66; H01L 23/367; H01L 23/5286; H01L 27/0605; H01L 29/2003; H01L 2223/6683
See application file for complete search history.

(56) References Cited

U.S. PATENT DOCUMENTS

| | | |
|---|---|---|
| 7,391,067 B1 | 6/2008 | Kumar |
| 2004/0142575 A1 | 7/2004 | Brewer |
| 2012/0063097 A1 | 3/2012 | Reza et al. |
| 2013/0208434 A1 | 8/2013 | Alm |

(Continued)

OTHER PUBLICATIONS

International Search Report (ISR) dated Dec. 28, 2021 of corresponding International Application No. PCT/US 21/54835 (eleven pages).

(Continued)

*Primary Examiner* — Samuel A Gebremariam
(74) *Attorney, Agent, or Firm* — Kilpatrick Townsend & Stockton LLP

(57) ABSTRACT

A monolithic microwave integrated circuit (MMIC) system includes a growth substrate, a device layer coupled to the growth substrate, a plurality of MMIC device elements coupled to the device layer, and a plurality of metallization structures coupled to the plurality of MMIC device elements. The MMIC system also includes a carrier substrate coupled to the plurality of metallization structures and a cooling structure coupled to the carrier substrate.

16 Claims, 20 Drawing Sheets

(56) References Cited

U.S. PATENT DOCUMENTS

| | | |
|---|---|---|
| 2019/0139859 A1 | 5/2019 | Odnoblyudov et al. |
| 2019/0172709 A1* | 6/2019 | Odnoblyudov ..... H01L 27/0629 |
| 2020/0176393 A1 | 6/2020 | Ketterson |
| 2020/0176416 A1* | 6/2020 | Ketterson ............... H01L 24/20 |

OTHER PUBLICATIONS

International Preliminary Report on Patentability dated Apr. 27, 2023 of corresponding International Application No. PCT/US2021/054835 (ten pages).

Supplementary European Search Report dated Oct. 14, 2024 from corresponding European Application No. 21881023.2; eleven pages.

\* cited by examiner

SYSTEMS FOR FABRICATION OF MMIC AND RF DEVICES ON ENGINEERED SUBSTRATES

CROSS-REFERENCES TO RELATED APPLICATIONS

This application claims priority to U.S. Provisional Patent Application No. 63/091,777, filed on Oct. 14, 2020, the disclosure of which is hereby incorporated by reference in its entirety for all purposes.

BACKGROUND OF THE INVENTION

High frequency, high performance radio frequency (RF) integrated devices, such as high frequency transistors or high-electron-mobility transistors (HEMTs), may be fabricated using compound semiconductors. For example, to fabricate RF devices, epitaxial layers, such as gallium nitride (GaN), may be formed by a heteroepitaxial (epi) growth process that involves depositing GaN on a semiconductor carrier substrate having a different lattice structure (or lattice constant) than the deposited GaN, such as silicon, silicon carbide (SiC), sapphire, or other substrate. The lattice mismatch between the GaN and the carrier substrate may create defects, dislocations, and strains that may negatively impact device yields and performance. In addition, the GaN layers and carrier substrate may have different coefficients of thermal expansion (CTEs). Thermal processing (e.g., GaN epitaxial growth) can crack or delaminate the GaN, or bow and, in some cases, break the carrier substrate. The different CTEs may restrict substrate wafer size, limit scale, and prevent reduction of the overall manufacturing cost of RF devices and solutions.

Monolithic microwave integrated circuit (MMIC) devices are integrated circuit devices that operate at microwave frequencies, for example, from 300 MHz to 300 GHz. MMIC devices are suitable for microwave mixing, power amplification, and high-frequency switching, among other applications. Despite the progress made in RF and MMIC device fabrication, there exists a need in the art for improved methods and systems related to the fabrication of RF and MMIC devices.

SUMMARY OF THE INVENTION

The present invention relates generally to methods and systems for fabricating RF and MMIC devices using engineered substrates. More specifically, the present invention relates to methods and systems for fabricating MMIC device structures using engineered substrates. Merely by way of example, the invention has been applied to a method and system for fabricating MMIC devices using a device layer coupled to an alternative engineered substrate that is characterized by low loss during high frequency operation of the MMIC devices. The methods and techniques can be applied to a variety of semiconductor processing operations.

According to an embodiment of the present invention, a monolithic microwave integrated circuit (MMIC) system is provided. The MMIC system includes a growth substrate, a device layer coupled to the growth substrate, and a plurality of MMIC device elements coupled to the device layer. The MMIC system also includes a plurality of metallization structures coupled to the plurality of MMIC device elements, a carrier substrate coupled to the plurality of metallization structures, and a cooling structure coupled to the carrier substrate.

According to another embodiment of the present invention, a method of fabricating a MMIC system is provided. The method includes providing an engineered substrate including a growth substrate and a device layer coupled to the growth substrate, fabricating a plurality of MMIC device elements using the device layer, and providing a carrier substrate including a plurality of metallic structures. The method also includes bonding the plurality of metallic structures to the plurality of MMIC device elements, removing a portion of the growth substrate, and removing a portion of the carrier substrate. The method further includes forming a ground/power plane coupled to the growth substrate, forming a plurality of vias passing from the ground/power plane to one or more of the plurality of MMIC device elements, and joining a cooling structure to the carrier substrate.

According to a specific embodiment of the present invention, a monolithic microwave integrated circuit (MMIC) system is provided. The MMIC system includes an alternative engineered substrate, a device layer coupled to the alternative engineered substrate, a plurality of MMIC device elements coupled to the device layer, and a carrier substrate coupled to the plurality of metallization structures. The MMIC system also includes a ground/power plane coupled to the alternative engineered substrate, a plurality of vias connecting the ground/power plane to the plurality of MMIC device elements, and a cooling structure coupled to the ground/power plane.

A coefficient of thermal expansion (CTE) of the alternative engineered substrate can substantially match a CTE of the device layer. The alternative engineered substrate can include a polycrystalline ceramic core, for example, aluminum nitride. A thickness of the device layer can be greater than 1 μm. A second plurality of vias can connect a second ground/power plane coupled to the plurality of MMIC device elements.

According to another specific embodiment of the present invention, a method of fabricating a MMIC system is provided. The method includes providing an engineered substrate including a growth substrate and a device layer coupled to the growth substrate, fabricating a plurality of MMIC device elements using the device layer, providing a carrier substrate, bonding the carrier substrate to the plurality of MMIC device elements, and removing the growth substrate. The method also includes bonding an alternative engineered substrate to the device layer, removing a portion of the alternative engineered substrate, forming a ground/power plane coupled to the alternative engineered substrate, forming a plurality of vias passing from the ground/power plane to one or more of the plurality of MMIC device elements, and joining a cooling structure to the ground/power plane.

In some embodiments, the method also include removing at least a portion of the carrier substrate. Additionally, the method can include forming a second ground/power plane coupled to a remaining portion of the carrier substrate and forming a second plurality of vias passing from the second ground/power plane to one or more of the plurality of MMIC device elements. A coefficient of thermal expansion (CTE) of the alternative engineered substrate can substantially match a CTE of the device layer. The alternative engineered substrate can include a polycrystalline ceramic core, for example, aluminum nitride. A thickness of the device layer can be greater than 1 μm.

According to a particular embodiment of the present invention, a monolithic microwave integrated circuit (MMIC) system is provided. The MMIC system includes an alternative engineered substrate, a device layer coupled to the alternative engineered substrate, a plurality of MMIC device elements coupled to the device layer, a ground/power plane coupled to the alternative engineered substrate, a plurality of vias connecting the ground/power plane to the plurality of MMIC device elements, and a cooling structure coupled to the ground/power plane.

A coefficient of thermal expansion (CTE) of the alternative engineered substrate can substantially match a CTE of the device layer. The alternative engineered substrate can include a polycrystalline ceramic core, for example, aluminum nitride. A thickness of the device layer can be between 1 μm and 10 μm. In an embodiment, the MMIC system can also include a carrier substrate coupled to the plurality of MMIC device elements.

According to another particular embodiment of the present invention, a method of fabricating a MMIC system is provided. The method includes providing an engineered substrate including a growth substrate and a device layer coupled to the growth substrate, bonding a handle substrate to the device layer, and removing the growth substrate. The method also includes bonding an alternative engineered substrate to the device layer, removing the handle substrate, fabricating a plurality of MMIC device elements using the device layer, and removing a portion of the alternative engineered substrate. The method further includes forming a ground/power plane coupled to a remaining portion of the alternative engineered substrate, forming a plurality of vias passing from the ground/power plane to one or more of the plurality of MMIC device elements, and joining a cooling structure to the ground/power plane.

Numerous benefits are achieved by way of the present invention over conventional techniques. For example, embodiments of the present invention provide systems and methods for fabricating MMIC devices that can be produced at lower cost by means of fabrication on large area substrates as well as easier/quicker fabrication steps. These and other embodiments of the invention along with many of its advantages and features are described in more detail in conjunction with the text below and attached figures.

DETAILED DESCRIPTION OF SPECIFIC EMBODIMENTS

Discrete RF devices and MMIC devices have different design constraints and benefit from different semiconductor structures. Both discrete RF devices and MMIC devices preferably have low thermal resistance, low parasitic drain-source capacitance, and high mobility and high carrier density, which enables the formation of a two dimensional electron gas in device structures including HEMT structures. Moreover, both discrete RF devices and MMIC devices preferably have low current collapse, due to trapping in buffer layer(s) and at the device surface and should be compatible with the formation of through substrate vias suitable for high power operation. In addition to these design constraints and benefits characterizing discrete RF devices, MMIC devices preferably have low substrate losses, which can be utilized as waveguides, and thick (e.g., on the order of 50 μm to 100 μm), semi-insulating substrates suitable for high power waveguides.

Figure 1:
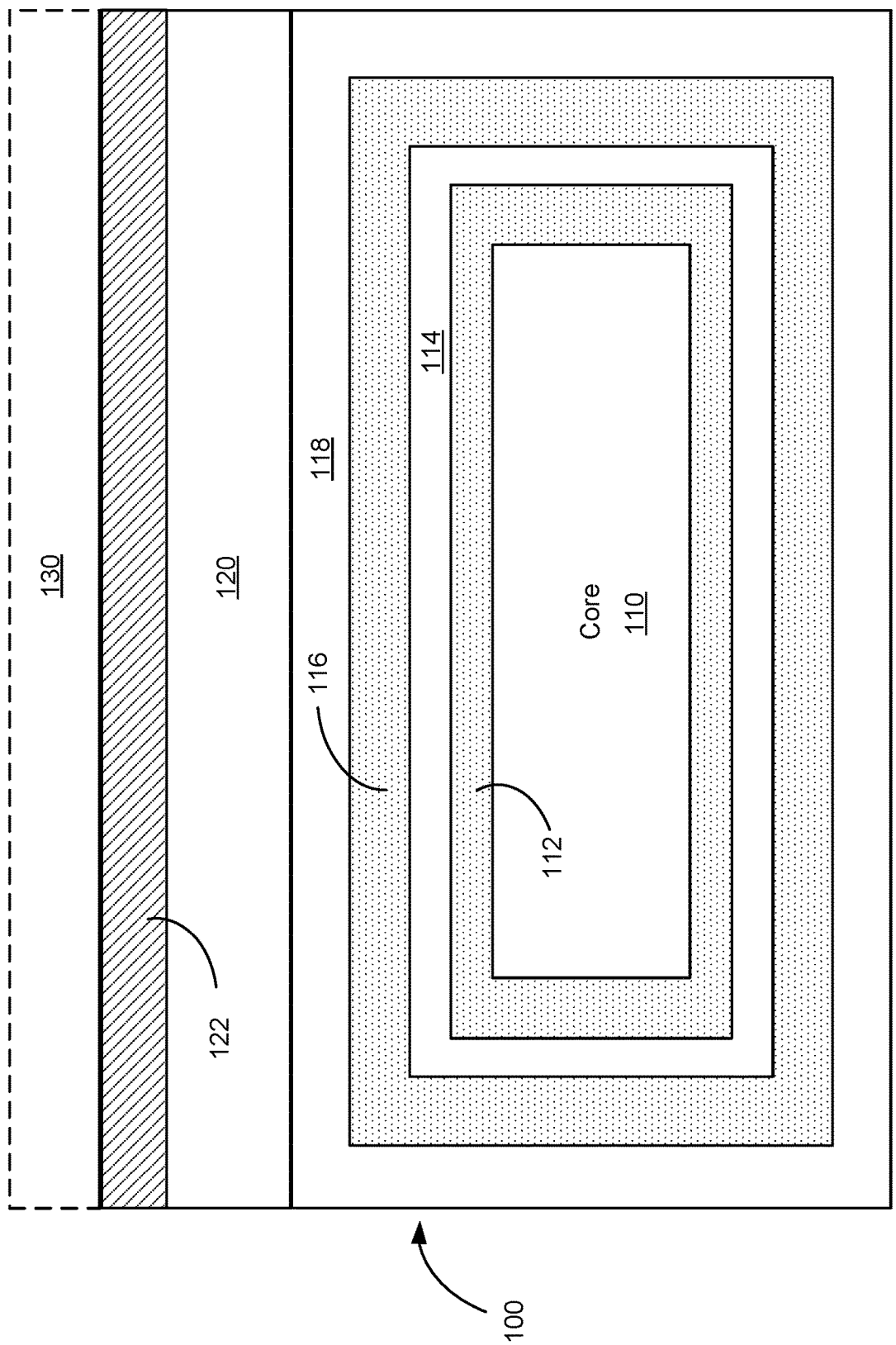
FIG. 1 is a simplified schematic diagram illustrating an engineered substrate according to an embodiment of the present invention.

FIG. 1 is a simplified schematic diagram illustrating an engineered substrate 100, according to an embodiment of the present invention. Engineered substrate 100 illustrated in FIG. 1 is suitable for a variety of electronic and optical applications. Engineered substrate 100 includes a core 110 that can have a coefficient of thermal expansion (CTE) that is substantially matched to the CTE of the epitaxial material that will be grown on engineered substrate 100. An epitaxial material 130, which may include GaN or GaN-based materials, is illustrated as optional because it is not required as an element of engineered substrate 100, but will typically be grown on engineered substrate 100. In some embodiments, engineered substrate 100 is referred to as an engineered substrate structure since it may include one or more layers or elements deposited on or otherwise joined to the engineered substrate.

For applications including the growth of gallium nitride (GaN)-based materials (epitaxial layers including GaN-based layers), core 110 can be a polycrystalline ceramic material, for example, polycrystalline aluminum nitride (AlN), which may include binding agents, such as yttrium oxide. Other materials can be utilized as core 110, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like. The thickness of core 110 can be on the order of 100 to 1,500 μm, for example, 750 μm.

Core 110 may be encapsulated in a first adhesion layer 112 that can be referred to as a shell or an encapsulating shell. In an embodiment, first adhesion layer 112 comprises a tetraethyl orthosilicate (TEOS) oxide layer on the order of 1,000 Å in thickness. In other embodiments, the thickness of first adhesion layer 112 varies, for example, from 100 Å to 2,000 Å. Although TEOS oxides, which include oxide materials that are deposited using TEOS as a precursor, can be utilized for adhesion layers in some embodiments, other materials that provide for adhesion between later deposited layers and underlying layers or materials (e.g., ceramics, in particular, polycrystalline ceramics) can be utilized according to other embodiments of the present invention. For example, $SiO_2$ or other silicon oxides ($Si_xO_y$) may adhere well to ceramic materials and may provide a suitable surface for subsequent deposition, for example, of conductive materials. In some embodiments, first adhesion layer 112 completely surrounds core 110 in some embodiments to form a fully encapsulated core and can be formed using an LPCVD process or other suitable deposition processes, which can be compatible with semiconductor processing, and in particular, with polycrystalline or composite substrates and layers. In some embodiments, first adhesion layer 112 may be formed on one side of core 110. First adhesion layer 112 provides a surface on which subsequent layers adhere to form elements of the engineered substrate.

In addition to the use of LPCVD processes, spin on glass/dielectrics, furnace-based processes, and the like, to form the encapsulating adhesion layer, other semiconductor processes can be utilized according to embodiments of the present invention, including CVD processes or similar deposition processes. As an example, a deposition process that coats a portion of the core can be utilized; the core can be flipped over, and the deposition process could be repeated to coat additional portions of the core. Thus, although LPCVD techniques are utilized in some embodiments to provide a fully encapsulated structure, other film formation techniques can be utilized, depending on the particular application.

A conductive layer 114 is formed on first adhesion layer 112. In an embodiment, conductive layer 114 is a shell of polysilicon (i.e., polycrystalline silicon) that is formed surrounding first adhesion layer 112 since polysilicon can exhibit poor adhesion to ceramic materials. In embodiments in which conductive layer 114 is polysilicon, the thickness of the polysilicon layer can be on the order of 500-5,000 Å, for example, 2,500 Å. In some embodiments, the polysilicon layer can be formed as a shell to completely surround first adhesion layer 112 (e.g., a TEOS oxide layer), thereby forming a fully encapsulated adhesion layer, and can be formed using an LPCVD process. In other embodiments, the conductive material can be formed on a portion of the adhesion layer, for example, an upper half of the substrate. In some embodiments, the conductive material can be formed as a fully encapsulating layer and can be subsequently removed on one side of the substrate.

In an embodiment, conductive layer 114 can be a polysilicon layer doped to provide a highly conductive material. For example, conductive layer 114 may be doped with boron to provide a p-type polysilicon layer. In some embodiments, the doping with boron is at a level of $1 \times 10^{19}$ $cm^{-3}$ to $1 \times 10^{20}$ $cm^{-3}$ to provide for high conductivity. Other dopants at different dopant concentrations (e.g., phosphorus, arsenic, bismuth, or the like at dopant concentrations ranging from $1\times10^{16}$ cm$^{-3}$ to $5\times10^{18}$ cm$^{-3}$) can be utilized to provide either n-type or p-type semiconductor materials suitable for use in the conductive layer. One of ordinary skill in the art would recognize many variations, modifications, and alternatives.

The presence of conductive layer 114 is useful during electrostatic chucking of the engineered substrate to semiconductor processing tools, for example tools with electrostatic chucks (ESCs or e-chucks). Conductive layer 114 enables rapid dechucking after processing in the semiconductor processing tools. In embodiments of the present invention, the conductive layer enables electrical contact with the chuck or capacitive coupling to the e-chuck during future processing including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with the ESD chucking may provide better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 116 (e.g., a TEOS oxide layer on the order of 1,000 Å in thickness) is formed on conductive layer 114. Second adhesion layer 116 completely surrounds conductive layer 114 in some embodiments to form a fully encapsulated structure and can be formed using an LPCVD process, a CVD process, or any other suitable deposition process, including the deposition of a spin-on dielectric.

A barrier layer 118, for example, a silicon nitride layer, is formed on second adhesion layer 116. In an embodiment, barrier layer 118 is a silicon nitride layer that is on the order of 4,000 Å to 5,000 Å in thickness. Barrier layer 118 completely surrounds the second adhesion layer in some embodiments to form a fully encapsulated structure and can be formed using an LPCVD process. In addition to silicon nitride layers, amorphous materials including SiCN, SiON, AlN, SiC, and the like can be utilized as the barrier layers. In some implementations, barrier layer 118 includes a number of sub-layers that are built up to form barrier layer 118. Thus, the term barrier layer is not intended to denote a single layer or a single material, but is to encompass one or more materials layered in a composite manner. One of ordinary skill in the art would recognize many variations, modifications, and alternatives.

In some embodiments, barrier layer 118, e.g., a silicon nitride layer, prevents diffusion and/or outgassing of elements present in the core, for example, yttrium (elemental), yttrium oxide (i.e., yttria), oxygen, metallic impurities, other trace elements, and the like, into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN, that are designed for non-clean room environments, can be utilized in semiconductor process flows and clean room environments.

In some embodiments, ceramic materials utilized to form the core may be fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which may be conducted at much lower temperatures in the range of 800° C. to 1,100° C., it would be expected that the subsequent diffusion of these impurities would be insignificant. However, contrary to conventional expectations, even during epitaxial growth processes at temperatures much lower than the firing temperature of the ceramic materials, significant diffusion of elements through the layers of the engineered substrate may be present. Thus, embodiments of the present invention integrate the barrier layer into the engineered substrate to prevent this undesirable diffusion.

Thus, some embodiments of the present invention integrate a silicon nitride layer as barrier layer 118 to prevent out-diffusion of the background elements from the polycrystalline ceramic material (e.g., AlN) into the engineered layers and epitaxial layers such as optional GaN layer 130. The barrier layer 118 encapsulating the underlying layers and material provides the desired barrier layer functionality. The integration of the barrier layer 118 into the engineered substrate prevents the diffusion of calcium, yttrium, and aluminum into the engineered layers during the annealing process, which would typically occur if the barrier layer was not present. Thus, the use of the barrier layer 118 prevents these elements from diffusing through the barrier layer and thereby prevents their release into the environment surrounding the engineered substrate. Similarly, any other impurities contained within the bulk ceramic material would be contained by the barrier layer.

A bonding layer 120 (e.g., a silicon oxide layer) may be deposited on a portion of barrier layer 118, for example, on the top surface of barrier layer 118, and subsequently used during the bonding of a substantially single crystal layer 122 (e.g., a single crystal silicon layer such as exfoliated silicon (111) layer). Bonding layer 120 can be approximately 1.5 μm in thickness in some embodiments. In some embodiments, the thickness of bonding layer 120 is 20 nm or more for bond-induced void mitigation. In some embodiments, the thickness of bonding layer 120 is in the range of 0.75-1.5 μm.

Bonding layer 120 can be formed by a deposition of a thick (e.g., 2-5 μm thick) oxide layer followed by a chemical mechanical polishing (CMP) process to thin the oxide to approximately 1.5 μm or less in thickness. The thick initial oxide serves to smooth surface features present on the support structure that may remain after fabrication of the polycrystalline core and continue to be present as the encapsulating layers illustrated in FIG. 1 are formed. The CMP process provides a substantially planar surface free of voids, which can then be used during a wafer transfer process to bond single crystal silicon layer 122 to bonding layer 120.

The substantially single crystal layer 122 (e.g., exfoliated Si (111)) is suitable for use as a growth layer during an epitaxial growth process for the formation of epitaxial materials. In some embodiments, the epitaxial material can include a GaN layer of 2 μm to 10 μm in thickness, which can be utilized as one of a plurality of layers utilized in optoelectronic, RF, and power devices. In an embodiment, substantially single crystal layer 122 includes a single crystal silicon layer that is attached to the bonding layer using a layer transfer process.

A layer transfer process may be performed using a silicon wafer. The silicon wafer may be implanted with several elements to create a damage interface inside Si, which may help to form single crystal layer 122 for attaching to bonding layer 120. For example, applying pressure on the silicon wafer and bonding layer 120 that are attached together may atomically bond the silicon wafer to bonding layer 120.

After the bonding process, an exfoliation process may activate the damage interface inside the silicon wafer and cause the implanted elements in single crystal layer 122 to expand, thus splitting the top portion of the silicon wafer from ceramic wafer 110 with engineered layers. Remaining single crystal layer 122 bonded to bonding layer 120 may be relatively thin, such as less than around 5 microns, and therefore may not significantly contribute to the CTE of engineered substrate 100. The CTE of engineered substrate 100 is therefore primarily determined by the CTE of ceramic core 110.

Materials other than silicon may be used to create a single crystal thin bonding layer. These single crystal materials may include SiC, GaN, AlGaN, AlN, ZnO, sapphire, and other.

GaN epitaxial layer 130 (which may also be referred to as epitaxial layers) can be formed by epitaxially growing a number of layers or sub-layers to form an epitaxial structure on top of engineered substrate 110. As described more fully herein, GaN epitaxial layer 130 is an example of a device layer that is epitaxially grown on a substrate. As will be evident to one of skill in the art, epitaxial structures suitable for fabrication and MMIC and RF devices do not necessarily consist of a single epitaxial layer, but can include a number of layers of different composition, thickness, doping density and the like. Accordingly, as used herein, the term "layer" and "device layer" should be understood to include a structure including multiple layers or sub-layers of the same or different materials. In some embodiments, a buffer layer may be formed on bonding layer 120, and GaN epitaxial layer 130 (epitaxial layers) may be formed on top of the buffer layer. The CTEs of ceramic wafer 110 and GaN epitaxial layer 130 may be substantially matched over a wide temperature range (e.g., from about 25° C. to about 1200° C.), such as within about 0.1%, 0.5%, 1%, 2%, 5%, or 10% of each other. This CTE matching enables the formation of higher quality epitaxial layers on larger ceramic wafers 110 without cracking or warping. For example, GaN epitaxial layer 130 may be formed on 6-inch, 8-inch, 12-inch, or larger engineered substrates 100. Using larger wafers may increase the device count per wafer and thus result in less expensive GaN devices.

The CTE matching may also enable the formation of a significantly thicker GaN epitaxial layer 130 (e.g., tens or hundreds of microns) on top of engineered substrate 110. The combined epitaxial layers may reduce the overall dislocation density of the lattice structures between GaN epitaxial layer 130 and single crystal layer 122. In addition, a larger number of epitaxial layers can be used to fabricate more complex circuitry for a wider array of GaN devices.

Additional description related to the engineered substrate is provided in U.S. Pat. No. 10,297,445, issued on May 21, 2019, and U.S. Pat. No. 10,134,589, issued on Nov. 20, 2018, the disclosures of which are hereby incorporated by reference in their entirety for all purposes.

Figure 2:
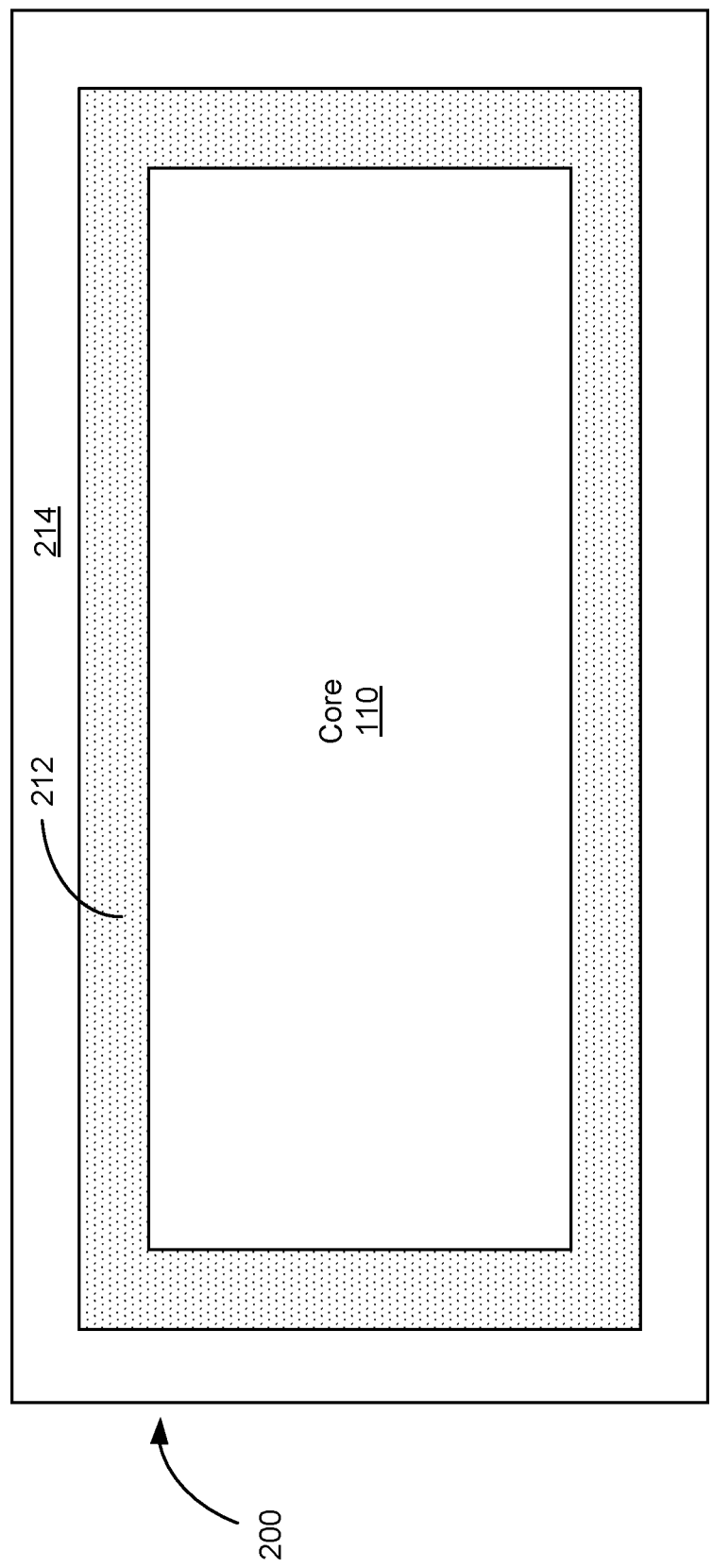
FIG. 2 is a simplified schematic diagram illustrating an alternative engineered structure according to an embodiment of the present invention.

FIG. 2 is a simplified schematic diagram illustrating an alternative engineered substrate according to an embodiment of the present invention. The alternative engineered substrate 200 illustrated in FIG. 2 shares some common elements with the engineered substrate 100 illustrated in FIG. 1 and the description provided in relation to FIG. 1 is applicable to FIG. 2 as appropriate. Referring to FIG. 2, alternative engineered substrate 200 includes a core 110, for example, polycrystalline AlN, which can have a coefficient of thermal expansion (CTE) that is substantially matched to the CTE of epitaxial materials that will be grown on alternative engineered substrate 200. In addition to polycrystalline AlN, other materials utilized to form core 110 can be utilized as discussed in relation to FIG. 1. The thickness of core 110 can be on the order of 100 to 1,500 µm, for example, 750 µm.

Core 110 may be encapsulated in an adhesion layer 212 that can be referred to as a shell or an encapsulating shell. Adhesion layer 212 can include a tetraethyl orthosilicate (TEOS) oxide layer on the order of 1,000 Å in thickness as discussed in relation to FIG. 1. Although TEOS oxides can be utilized for adhesion layers in some embodiments, other materials that provide for adhesion between later deposited layers and underlying layers or materials (e.g., ceramics, in particular, polycrystalline ceramics) can be utilized according to other embodiments of the present invention. In the illustrated embodiment, adhesion layer 212 completely surrounds core 110 to form a fully encapsulated core and can be formed using an LPCVD process or other suitable deposition processes.

A barrier layer 214, for example, a silicon nitride layer, is formed on adhesion layer 212. In an embodiment, barrier layer 214 is a silicon nitride layer that is on the order of 4,000 Å to 5,000 Å in thickness as discussed in relation to FIG. 1. Barrier layer 214 completely surrounds the adhesion layer 212 in the embodiment illustrated in FIG. 2 to form a fully encapsulated structure and can be formed using an LPCVD process. In addition to silicon nitride layers, amorphous materials including SiCN, SiON, AlN, SiC, and the like can be utilized as the barrier layers. In some implementations, barrier layer 214 includes a number of sub-layers that are built up to form barrier layer 214. Thus, the term barrier layer is not intended to denote a single layer or a single material, but is to encompass one or more materials layered in a composite manner. One of ordinary skill in the art would recognize many variations, modifications, and alternatives.

As discussed in relation to FIG. 1, barrier layer 214 prevents diffusion and/or outgassing of elements present in core 110, for example, yttrium (elemental), yttrium oxide (i.e., yttria), oxygen, metallic impurities, other trace elements, and the like, into the environment of the semiconductor processing chambers in which the alternative engineered substrate 200 could be present, for example, during a high temperature (e.g., 1,000° C.) epitaxial growth process. Thus, utilizing barrier layer 214 as described herein, ceramic materials, including polycrystalline AlN, that are designed for non-clean room environments, can be utilized in semiconductor process flows and clean room environments.

Figure 3A:
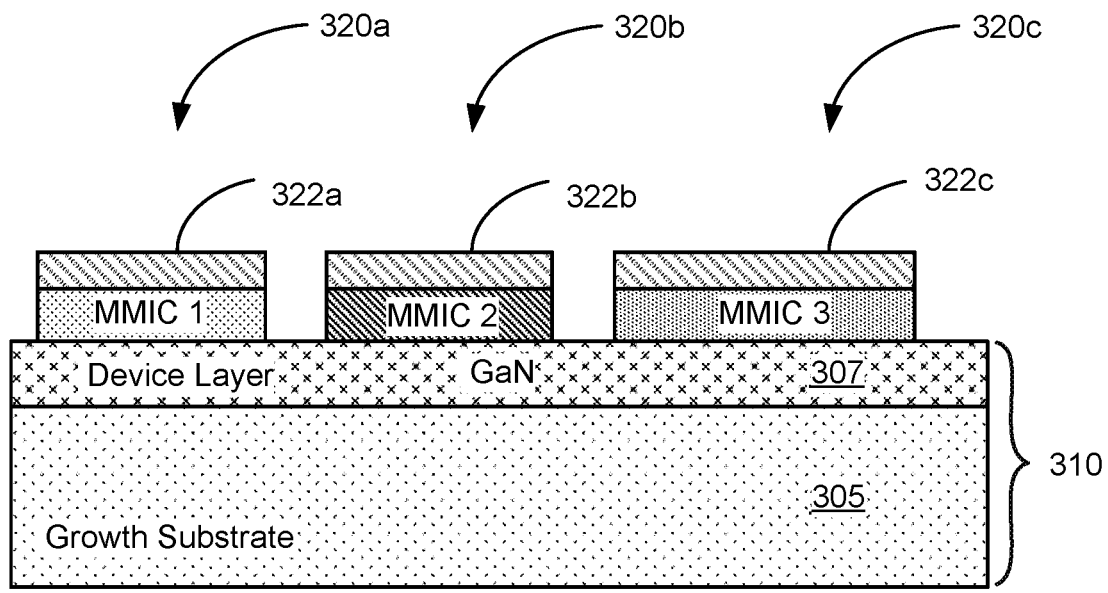
FIG. 3A is a cross-sectional view of MMIC device elements formed on an engineered substrate according to an embodiment of the present invention.

FIG. 3A is a cross-sectional view of MMIC device elements formed on an engineered substrate according to an embodiment of the present invention. In FIG. 3A, engineered substrate 310 includes a growth substrate 305 and a device layer 307 represented by a GaN layer in the illustrated embodiment. Growth substrate 305 and device layer 307 can be implemented using engineered substrate 100 as illustrated in FIG. 1, with device layer 307 corresponding to GaN epitaxial layer 130. Device layer 307 is utilized in the fabrication of MMIC device elements 320a, 320b, and 320c. Each of the MMIC device elements 320 represents a different MMIC device, for example, MMIC device element 320a can be a capacitor, MMIC device element 320b can be a transistor, and MMIC device element 320b can be a waveguide. Each of the different MMIC device elements 320 includes a metal structure 322. In FIG. 3A, device layer 307 is a GaN layer, can be on the order of 1 to 10 μm in thickness, and is utilized in order to reduce the loss and the capacitance.

Thus, MMIC device elements 320 represent devices that are fabricated in device layer 307. It will be obvious to one of skill in the art that the term "fabricated in the device layer" does not imply that all of the device elements are fabricated using the original semiconductor material making up the device layer and other materials can be deposited onto the device layer during the fabrication processes, which can include ion implantation, doping by diffusion, patterning and etching, deposition of insulators and metals for contacts, and the like. Thus, the MMIC device elements 320 illustrated in FIG. 3A are intended to represent a set of different device elements that can be utilized alone or in combination to form electronic components. As a result, although the discussion provided herein uses language indicating that the devices are fabricated in the device layer, it will be appreciated that the device layer provides a starting point for device fabrication, which can include the removal of portions of the device layer and the addition of other materials as appropriate to the particular device element. One of ordinary skill in the art would recognize many variations, modifications, and alternatives.

Figure 3B:
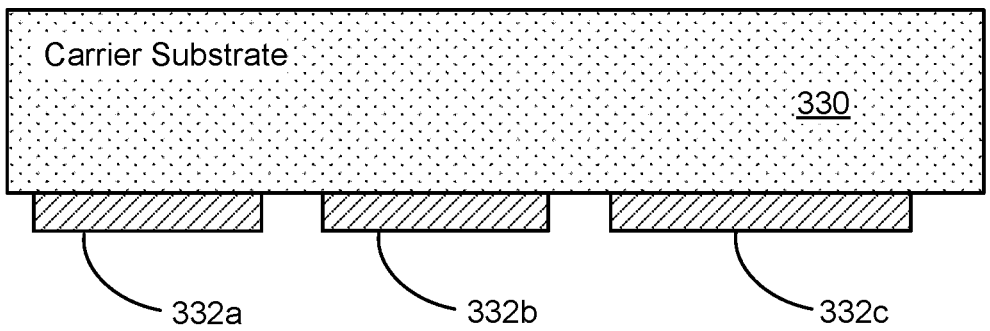
FIG. 3B is a cross-sectional view of a carrier substrate with metal interconnects according to an embodiment of the present invention.

FIG. 3B is a cross-sectional view of a carrier substrate with metal interconnects according to an embodiment of the present invention. In FIG. 3B, carrier substrate 330 has a plurality of metal interconnects 332 that correspond to the metal structures 322a, 322b, and 322c shown in FIG. 3A. At the stage of processing shown in FIG. 3B, carrier substrate 330 has been inverted to orient metal interconnects 332 for a subsequent bonding operation.

Figure 3C:
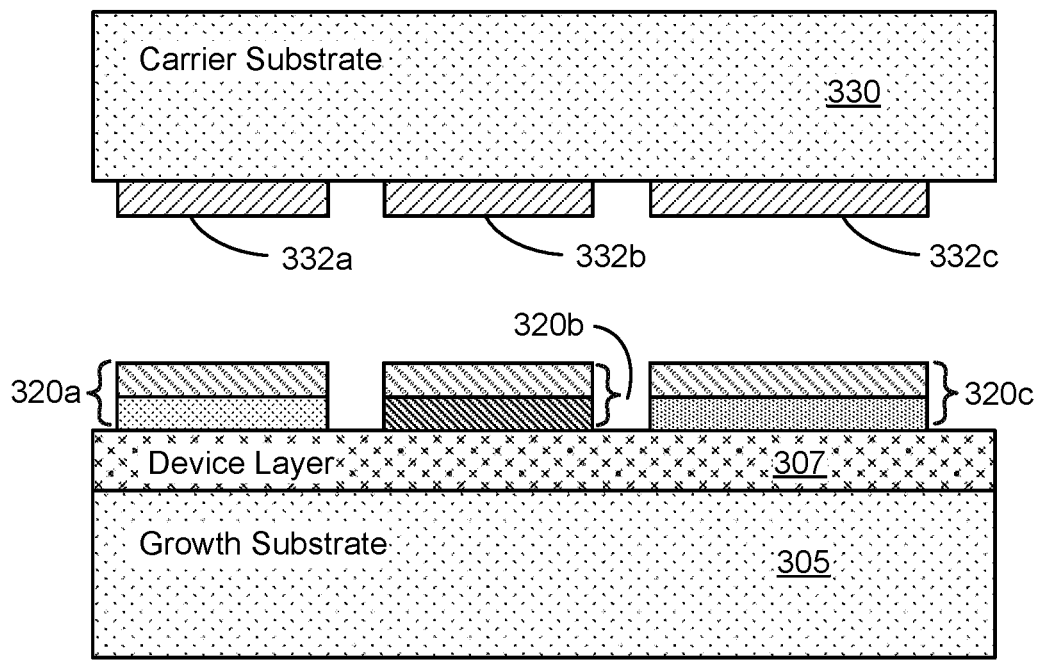
FIG. 3C is a cross-sectional view illustrating placement of the engineered substrate with MMIC device elements illustrated in FIG. 3A with respect to the carrier substrate with metal interconnects illustrated in FIG. 3C according to an embodiment of the present invention.

FIG. 3C is a cross-sectional view illustrating placement of the engineered substrate with MMIC device elements illustrated in FIG. 3A with respect to the carrier substrate with metal interconnects illustrated in FIG. 3C according to an embodiment of the present invention. As illustrated in FIG. 3C, the engineered substrate 310 with MMIC device elements 320 is positioned adjacent the carrier substrate 330 with metal interconnects 332 with the substrates facing each other. Alignment processes are utilized to align metal interconnects 332a, 332b, and 332c with metal structures 322a, 322b, and 322c.

Figure 3D:
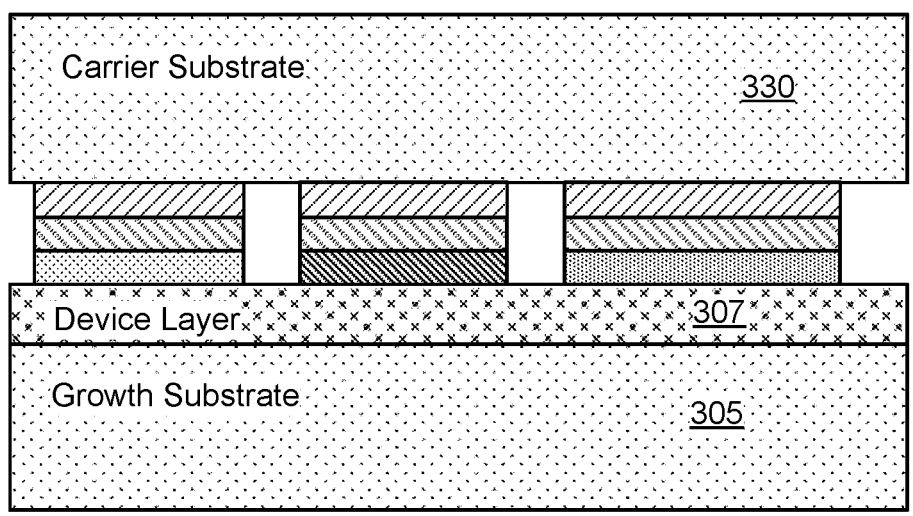
FIG. 3D is a cross-sectional view illustrating bonding of the engineered substrate with MMIC device elements to the carrier substrate with metal interconnects according to an embodiment of the present invention.

FIG. 3D is a cross-sectional view illustrating bonding of the engineered substrate with MMIC device elements to the carrier substrate with metal interconnects according to an embodiment of the present invention. As illustrated in FIG. 3D, after the bonding process has been completed, metal interconnects 332a, 332b, and 332c have been bonded to the corresponding metal structures 322a, 322b, and 322c. The metal-metal bonding illustrated in FIG. 3D provides a mechanically strong bond with high electrical conductivity.

Figure 3E:
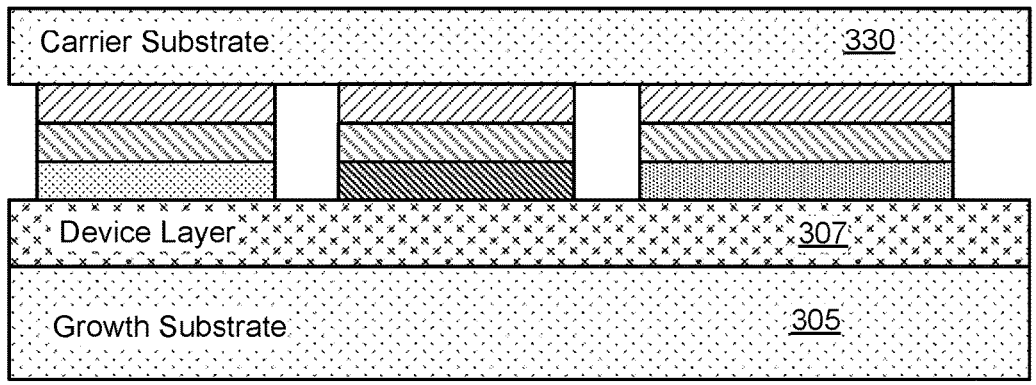
FIG. 3E is a cross-sectional view illustrating removal of a portion of the engineered substrate and a portion of the carrier substrate according to an embodiment of the present invention.

FIG. 3E is a cross-sectional view illustrating removal of a portion of the engineered substrate, i.e., a portion of growth substrate 305, and a portion of the carrier substrate 330 according to an embodiment of the present invention. In order to reduce thermal resistance, growth substrate 305 and carrier substrate 330 are thinned to a reduced thickness, for example, to a thickness on the order of 50 μm.

The substrate thinning process illustrated in FIG. 3E can be performed in several manners. As an example, a mechanical grinding process can be used to remove the majority of the carrier substrate 330. Then, a chemical etch, which can be a selective etch, can be used to remove materials and expose a layer of interest. As an example, the chemical etch may utilize potassium hydroxide (KOH) or tetramethylammonium hydroxide (TMAH) during the etching process. Finally, a physical etch, for example a reactive ion etch (RIE) process can be used to smooth and prepare surfaces for subsequent metallization and other processes.

Figure 3F:
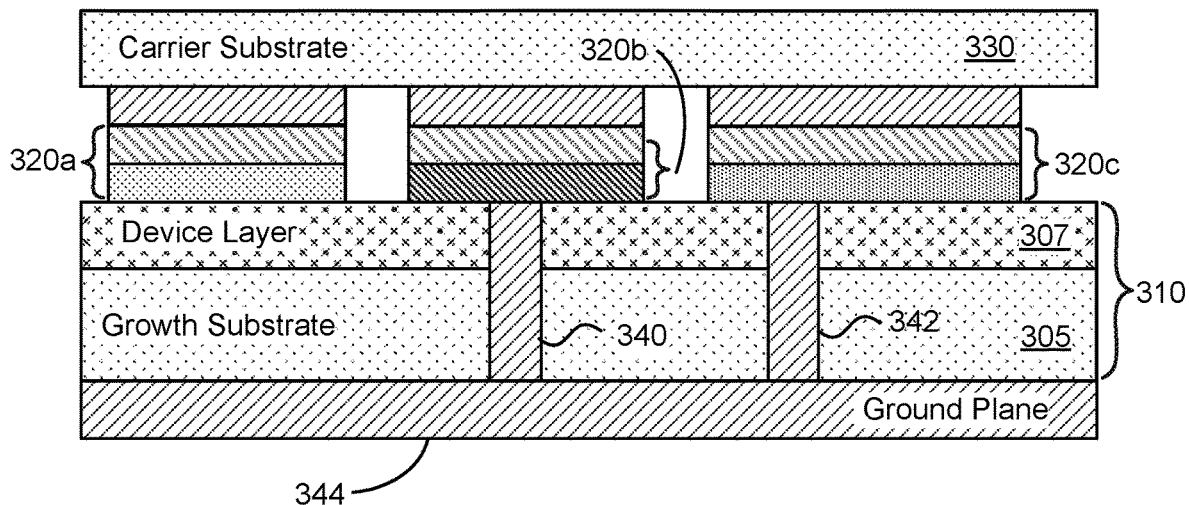
FIG. 3F is a cross-sectional view illustrating formation of vias in the engineered substrate according to an embodiment of the present invention.

FIG. 3F is a cross-sectional view illustrating formation of vias in the engineered substrate according to an embodiment of the present invention. In FIG. 3F, vias 340 and 342 are formed through the remaining portion of engineered substrate 310 to make electrical contact with MMIC device element 320b and MMIC device element 320c, respectively. A ground/power plane 344 is formed and is electrically connected to vias 340 and 342. Ground/power plane 344 is useful in providing access to ground or providing power from a power source depending on the particular application. Vias 340 and 342 can be fabricated using appropriate semiconductor processing techniques, including etching, laser ablation, or the like. In some embodiments, combinations of methods can be utilized to terminate the via formation process once MMIC device element 320b and MMIC device element 320c have been accessed.

Although only two vias, via 340 and via 342, are illustrated in FIG. 3F, with no via formed to MMIC device element 320a, this is not required by the present invention. In other embodiments, vias can be formed to every MMIC device element or vias can be formed to a smaller subset of the MMIC device elements. As an example, if MMIC device element 320a is a capacitor, no via can be provided.

It should be noted that although via formation is illustrated after engineered substrate 310 and carrier substrate 330 have been bonded, this is not required by the present invention and in other implementations; via formation can be performed after device fabrication as illustrated in FIG. 3A. One of ordinary skill in the art would recognize many variations, modifications, and alternatives.

Figure 3G:
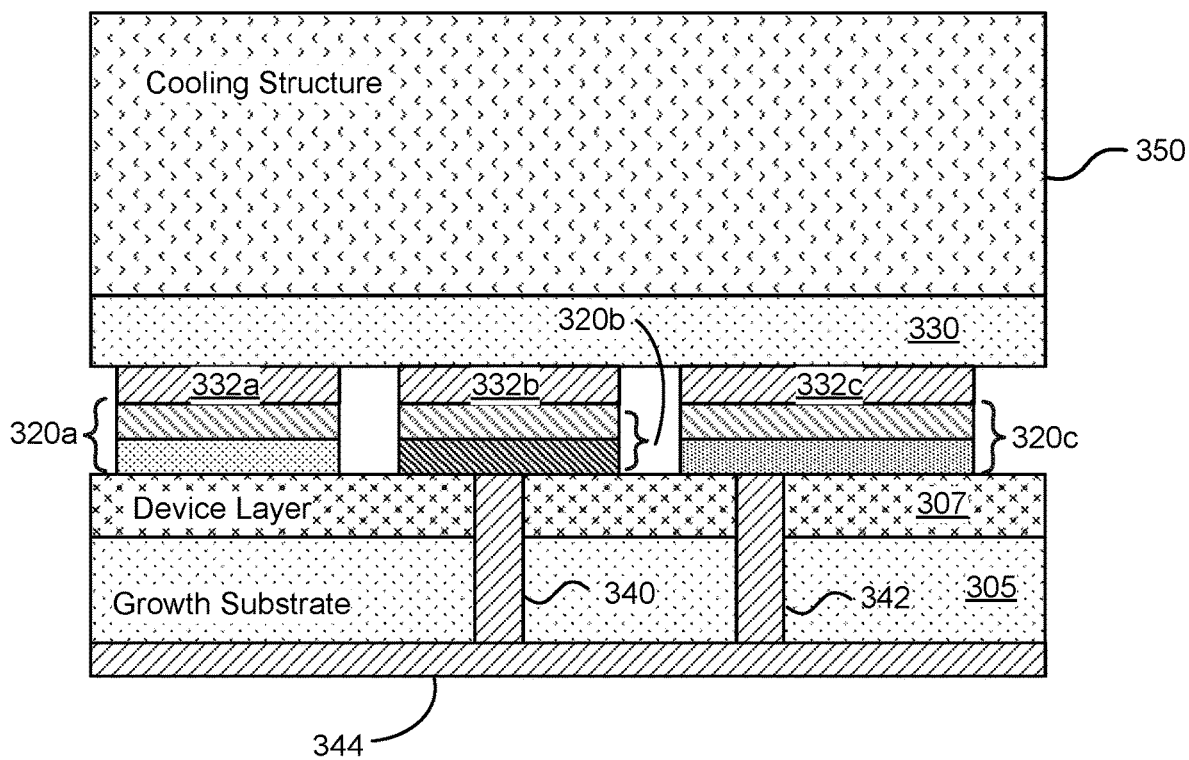
FIG. 3G is a cross-sectional view illustrating attachment of a cooling structure to the carrier substrate according to an embodiment of the present invention.

FIG. 3G is a cross-sectional view illustrating attachment of a cooling structure to the carrier substrate according to an embodiment of the present invention. Cooling structure 350 can be utilized to provide single sided cooling in a manner that decouples ground/power plane 344 from cooling structure 350. During device operation, heat generated by MMIC device elements 320 can be conducted through metal structures 322 and carrier substrate 330 to cooling structure 350.

Figure 3H:
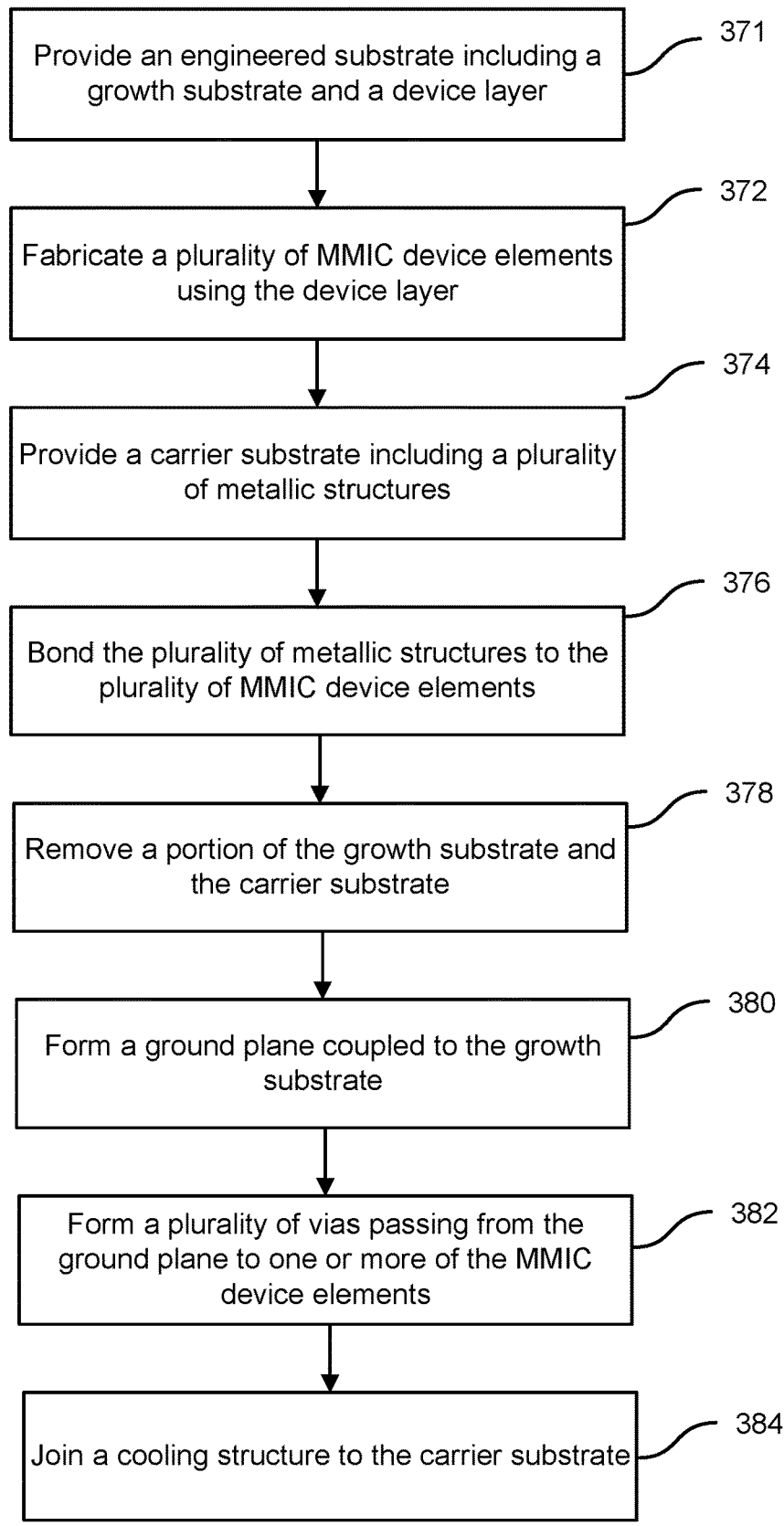
FIG. 3H is a simplified flowchart illustrating a method of fabricating a MMIC system according to an embodiment of the present invention.

FIG. 3H is a simplified flowchart illustrating a method of fabricating a MMIC system according to an embodiment of the present invention. The method 370 includes providing an engineered substrate including a growth substrate and a device layer coupled to the growth substrate (371) and fabricating a plurality of MMIC device elements using the device layer (372). The coefficient of thermal expansion (CTE) of the growth substrate can substantially match a CTE of the device layer. The growth substrate can comprise a polycrystalline ceramic core, for example, aluminum nitride. The thickness of the device layer can be between 1 and 10 μm and the device layer can include GaN and GaN-based materials.

The method also includes providing a carrier substrate including a plurality of metallic structures (374), bonding the plurality of metallic structures to the plurality of MMIC device elements (376), removing a portion of the growth substrate and removing a portion of the carrier substrate (378).

Additionally, the method includes forming a ground/power plane coupled to the growth substrate (380), forming a plurality of vias passing from the ground/power plane to one or more of the plurality of MMIC device elements (382), and joining a cooling structure to the carrier substrate (384). In some embodiments, the method additionally includes joining a second cooling structure to the ground/power plane. In some implementations, prior to joining the cooling structure to the carrier substrate, the method includes forming a second ground/power plane coupled to the carrier substrate and forming a second plurality of vias passing from the second ground/power plane to one or more of the plurality of metallic structures. The method may also include joining a second cooling structure to the ground/power plane.

It should be appreciated that the specific steps illustrated in FIG. 3H provide a particular method of fabricating a MMIC system according to an embodiment of the present invention. Other sequences of steps may also be performed according to alternative embodiments. For example, alternative embodiments of the present invention may perform the steps outlined above in a different order. Moreover, the individual steps illustrated in FIG. 3H may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 4A:
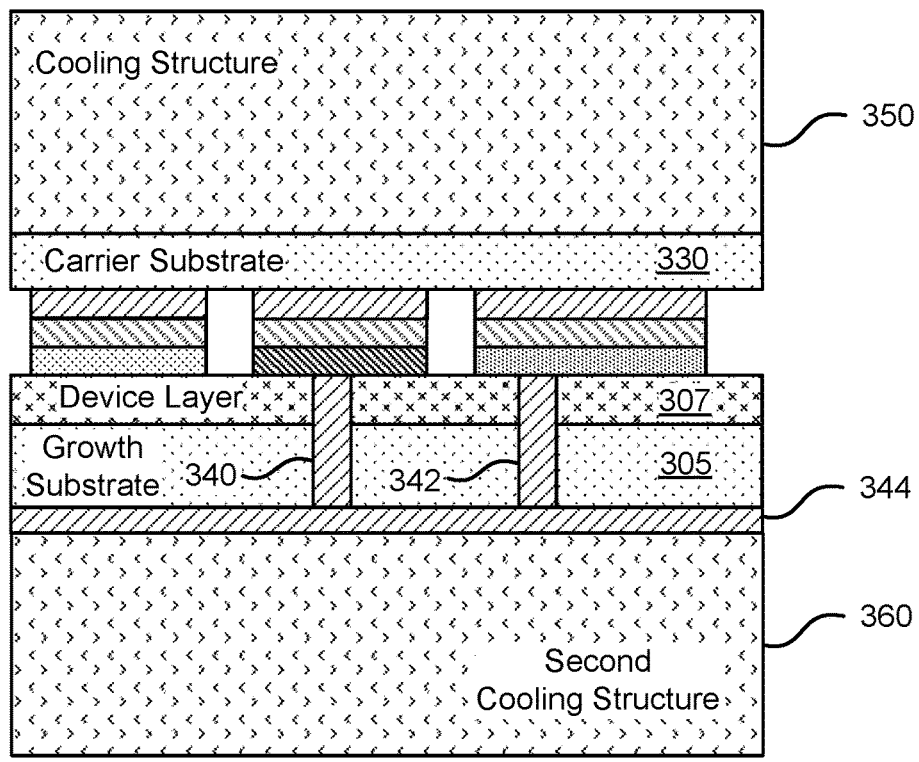
FIG. 4A is a cross-sectional view illustrating an alternative embodiment utilizing dual-sided cooling structures according to an embodiment of the present invention.

FIG. 4A is a cross-sectional view illustrating an alternative embodiment utilizing dual-sided cooling structures according to an embodiment of the present invention. In the alternative embodiment illustrated in FIG. 4A, a second cooling structure 360 has been attached to ground/power plane 344, providing dual-side cooling and higher levels of thermal performance.

Figure 4B:
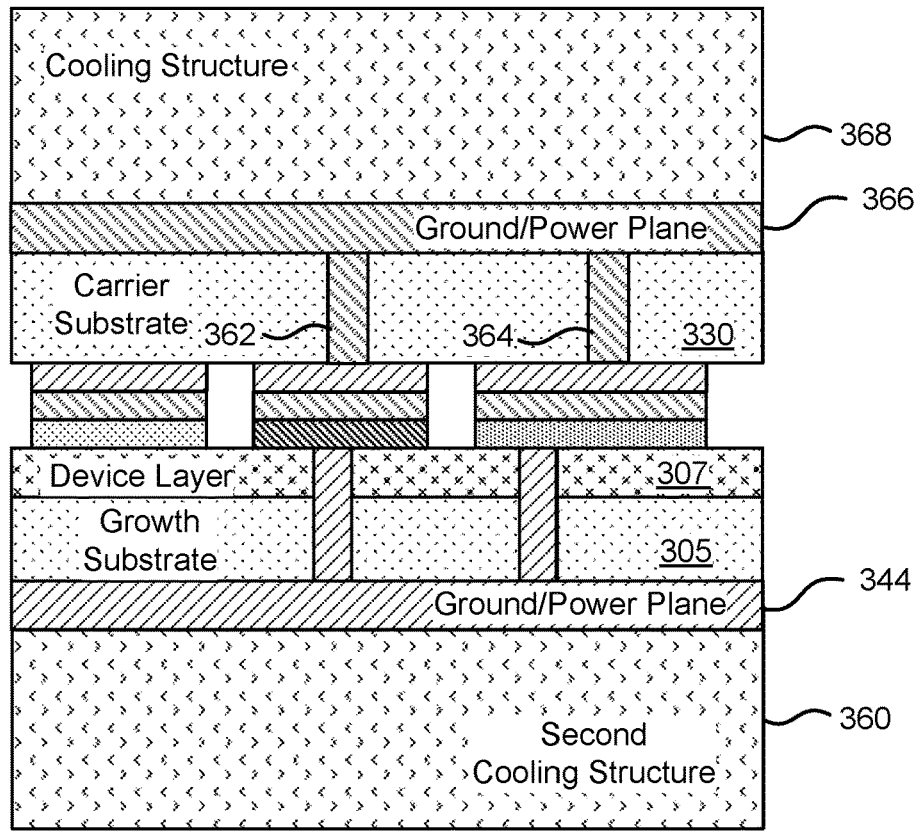
FIG. 4B is a cross-sectional view illustrating a second alternative embodiment utilizing dual-sided ground/power planes and cooling structures according to an embodiment of the present invention.

FIG. 4B is a cross-sectional view illustrating a second alternative embodiment utilizing dual-sided ground/power planes and cooling structures according to an embodiment of the present invention. In the second alternative embodiment illustrated in FIG. 4B, prior to attachment of cooling structure 368, additional vias 362 and 364 are formed passing through the remaining portion of carrier substrate 330 and electrically connected to ground/power plane 366.

Subsequently, cooling structure 368 is attached to ground/power plane 366. In this implementation, dual-sided electrical planes, i.e., ground/power plane 344 and ground/power plane 366 effectively provide a three layer circuit structure, enabling reduced routing complexity, reduced device area, and the like. Additionally, dual-sided cooling is provided as appropriate to the particular MMIC devices that are included in the apparatus. One of ordinary skill in the art would recognize many variations, modifications, and alternatives.

Figure 5A:
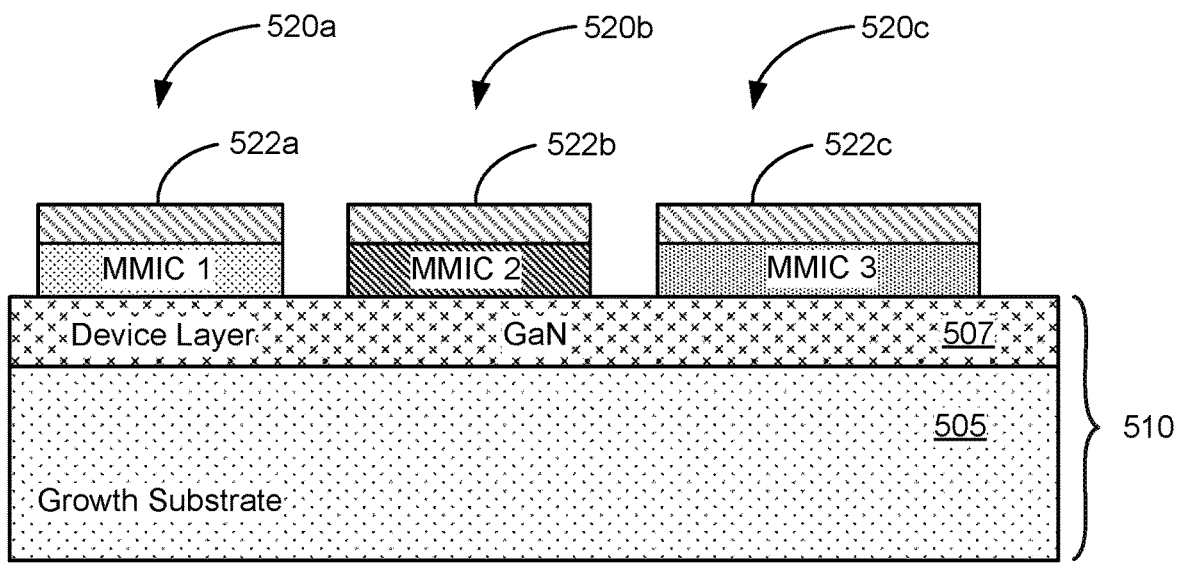
FIG. 5A is a cross-sectional view of MMIC device elements formed in a device layer of an engineered substrate according to an embodiment of the present invention.

FIG. 5A is a cross-sectional view of MMIC device elements formed in a device layer of an engineered substrate according to an embodiment of the present invention. In a manner similar to the MMIC device elements illustrated in FIG. 3A, engineered substrate 510 includes a growth substrate 505 and a device layer 507, which is represented by a GaN layer in the illustrated embodiment. Growth substrate 505 and device layer 507 can be implemented using engineered substrate 100 as illustrated in FIG. 1, with device layer 507 corresponding to GaN epitaxial layer 130. It should be appreciated that, although device layer 507 is illustrated as a single layer, this is not required by the present invention and device layer 507 can include multiple layers of different compositions, different doping densities, different thicknesses, and the like. A variety of epitaxial structures suitable for use in fabricating MMIC device elements are therefore represented by device layer 507. As mentioned previously, the CTE match between core 110 of engineered substrate 100 and the epitaxial materials making up device layer 507 enables high quality growth not provided by conventional techniques.

Device layer 507 is utilized in the fabrication of MMIC device elements 520a, 520b, and 520c. Each of the MMIC device elements 520 represents a different MMIC device, for example, MMIC device element 520a can be a capacitor, MMIC device element 520b can be a transistor, and MMIC device element 520b can be a waveguide. Each of the different MMIC device elements 520 includes a metal structure 522. In FIG. 5A, device layer 507 is a GaN layer, can be on the order of 1 to 10 μm in thickness, and is utilized in order to reduce the loss and the capacitance as well as improve the characteristics of the two-dimensional electron gas (2DEG) formed in some MMIC device structures and reduce trapping of electrons.

Thus, MMIC device elements 520 represent devices that are fabricated in device layer 507. It will be obvious to one of skill in the art that the term "fabricated in the device layer" does not imply that all of the device elements are fabricated using the original semiconductor material making up the device layer and other materials can be deposited onto the device layer during the fabrication processes, which can include ion implantation, doping by diffusion, patterning and etching, deposition of insulators and metals for contacts, and the like. Thus, the MMIC device elements 520 illustrated in FIG. 5A are intended to represent a set of different device elements that can be utilized alone or in combination to form electronic components. As a result, although the discussion provided herein uses language indicating that the devices are fabricated in the device layer, it will be appreciated that the device layer provides a starting point for device fabrication, which can include the removal of portions of the device layer and the addition of other materials as appropriate to the particular device element. One of ordinary skill in the art would recognize many variations, modifications, and alternatives.

Figure 5B:
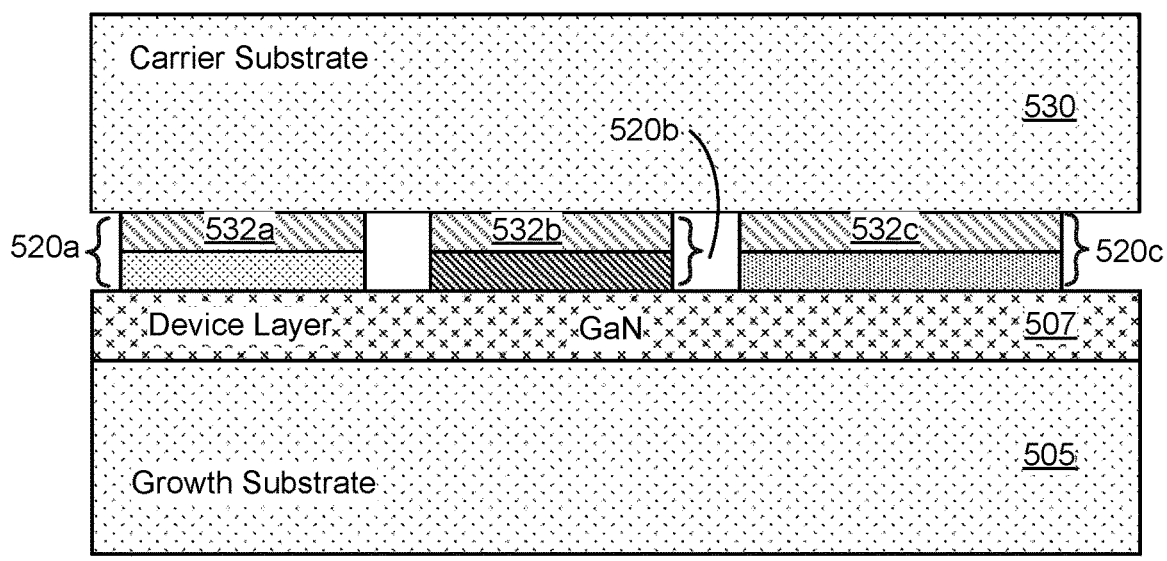
FIG. 5B is a cross-sectional view illustrating bonding of a carrier substrate to the MMIC device elements according to an embodiment of the present invention.

FIG. 5B is a cross-sectional view illustrating bonding of a carrier substrate to the MMIC device elements according to an embodiment of the present invention. As illustrated in FIG. 5B, a bonding process is utilized to join carrier substrate 530 to metal structures 522a, 522b, and 522c. In some embodiments, carrier substrate 530 is implemented as the alternative engineered substrate 200 illustrated in FIG. 2. Use of a carrier substrate 530 similar to alternative engineered substrate 200 provides a core for the carrier substrate, for example, polycrystalline AlN, that will have a CTE that is substantially matched to epitaxial materials present in other elements in the MMIC device structures, which can be beneficial during semiconductor processing operations. The use of an adhesion and barrier layer as discussed in relation to FIG. 2 enables the barrier layer, which can prevent out-diffusion of background elements present in the polycrystalline ceramic core into the environment surrounding the engineered substrate.

In some embodiments, carrier substrate 530 is bonded to metal structures 522a, 522b, and 522c using wafer bonding techniques including metal-to-metal bonding by providing a matching metal pattern on the carrier, or by oxide-to-oxide bonding by coating both wafers using, for example, SiO$_2$. In some embodiments, the bonding surface of carrier substrate 530 can be coated with an adhesion promoter to promote the strength of the bond. As an example, to implement metal-to-metal bonding, a metal layer (not shown) could be deposited on carrier substrate 530 and used during bonding to metal structures 522a, 522b, and 522c.

Figure 5C:
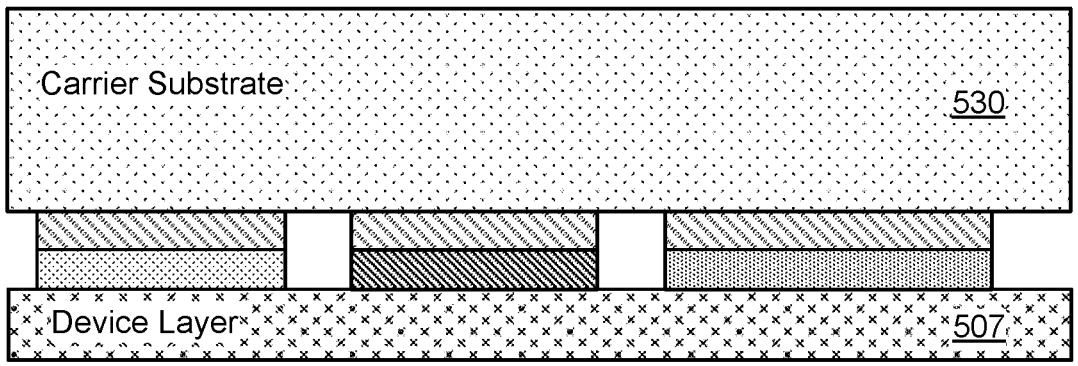
FIG. 5C is a cross-sectional view illustrating removal of a portion of the engineered substrate according to an embodiment of the present invention.

FIG. 5C is a cross-sectional view illustrating removal of a portion of the engineered substrate according to an embodiment of the present invention. A variety of techniques can be used to remove growth substrate 505, leaving device layer 507 bonded to carrier substrate 530. As an example, a chemical mechanical polishing (CMP) process, can be used to remove growth substrate 505, terminating at or in device layer 507. In other embodiments, a CMP process is used to remove a portion of growth substrate 505 and then chemical and/or physical etch processes are utilized to remove the remainder of growth substrate 505. Alternatively, a chemical etch, which can be a selective etch, can be used to remove a portion of or all of growth substrate 505. The chemical etch may be selective to terminate at a layer of interest, for example device layer 507. Finally, a physical etch, for example a reactive ion etch (ME) process, can be used to remove a portion or all of growth substrate 505 and/or to smooth and prepare device layer 507 for a subsequent bonding and processing steps.

The removal of the portion of the engineered substrate can be performed in several manners. As an example, a mechanical grinding process can be used to remove the majority of the engineered substrate. Then, a chemical etch, which can be a selective etch, can be used to remove materials and expose a layer of interest. Finally, a physical etch, for example a reactive ion etch (RIE) process, can be used to remove the interfacial layers.

The removal of growth substrate 505 enables structures to be removed that would otherwise result in loss during operation of the MMIC devices. As an example, engineered substrate 100 illustrated in FIG. 1 includes conductive layer 114, which can be a polysilicon layer doped to provide a highly conductive material. During high frequency operation, electric and/or magnetic fields generated by the MMIC devices may interact with such a conductive layer, resulting in losses, heat generation, and other undesirable effects. Accordingly, by removing growth substrate 505 and layers/structures in growth substrate 505 that would adversely impact MMIC device performance, embodiments of the present invention provide methods and systems that have lower losses than comparable conventional devices and structures.

As an example, device layers 507 could include buffer layers and other layers utilized during initial epitaxial growth, for example, epitaxial growth of GaN materials. These layers, including buffer layers, could, in a manner similar to a conductive layer, impair MMIC device performance, for instance, by introducing loss. Accordingly, as illustrated in FIG. 5C, these layers can be removed along with growth substrate 505. One of ordinary skill in the art would recognize many variations, modifications, and alternatives.

Figure 5D:
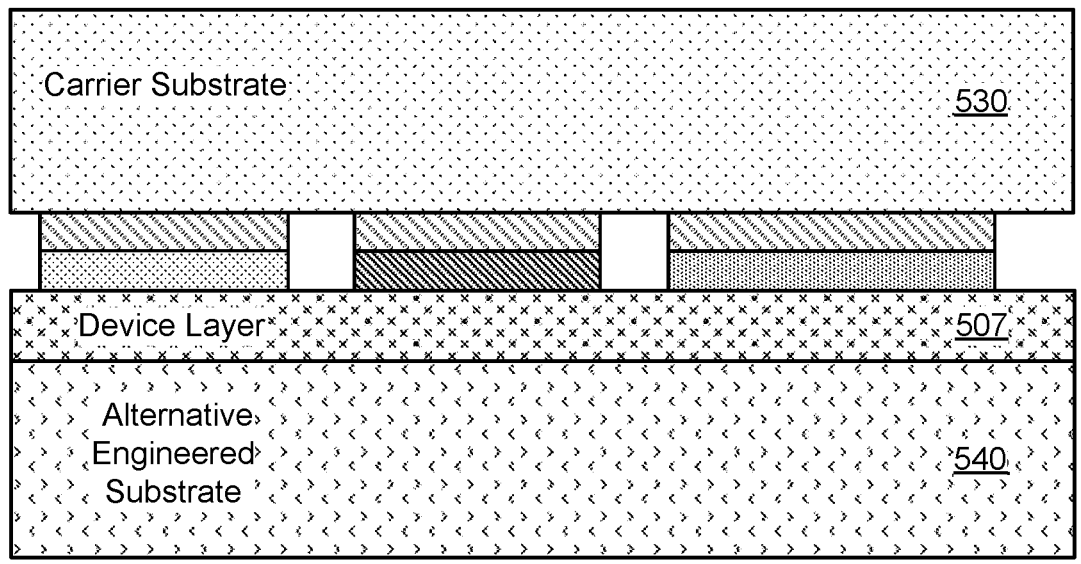
FIG. 5D is a cross-sectional view illustrating bonding of an alternative engineered substrate to the device layer according to an embodiment of the present invention.

FIG. 5D is a cross-sectional view illustrating bonding of an alternative engineered substrate to the device layer according to an embodiment of the present invention. In some embodiments, alternative engineered substrate 540 is implemented as the alternative engineered substrate 200 illustrated in FIG. 2. Use of alternative engineered substrate 540 similar to alternative engineered substrate 200 provides a core for the alternative engineered substrate, for example, polycrystalline AlN, that will have a CTE that is substantially matched to epitaxial materials present in other elements in the MMIC device structures, which can be beneficial during semiconductor processing operations. Additionally, as discussed in relation to the removal of growth substrate 505, alternative engineered substrate 540 can be fabricated using materials that are compatible with low loss, high frequency operation. As an example, alternative engineered substrate 540 can be substantially free of silicon, which could adversely impact MMIC device performance.

In some embodiments, alternative engineered substrate 540 is bonded to device layer 507 using wafer bonding techniques including metal-to-metal bonding by providing a matching metal pattern on the carrier, or by oxide-to-oxide bonding by coating both wafers using, for example, $SiO_2$. In some embodiments, the bonding surface of alternative engineered substrate 540 can be coated with an adhesion promoter to promote the strength of the bond.

Figure 5E:
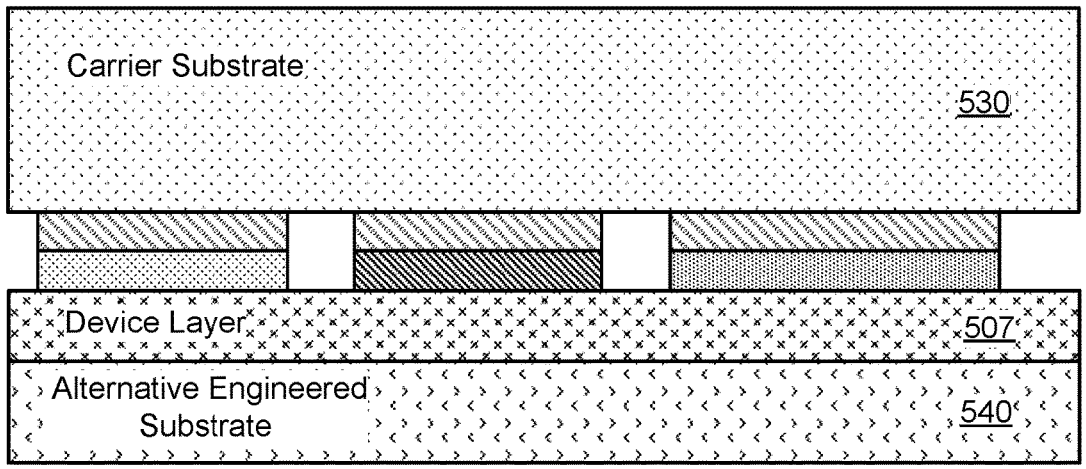
FIG. 5E is a cross-sectional view illustrating removal of a portion of the alternative engineered substrate according to an embodiment of the present invention.

FIG. 5E is a cross-sectional view illustrating removal of a portion of the alternative engineered substrate according to an embodiment of the present invention. As discussed in relation to FIG. 3E, in order to reduce thermal resistance, alternative engineered substrate 540 is thinned to a reduced thickness, for example, to a thickness on the order of 50 μm.

The substrate thinning process illustrated in FIG. 5E can be performed in several manners. As an example, a mechanical grinding process can be used to remove a portion of alternative engineered substrate 540. Then a chemical etch, which can be a selective etch, can be used to remove the illustrated portion of alternative engineered substrate 540. As an example, the chemical etch may utilize potassium hydroxide (KOH) or tetramethylammonium hydroxide (TMAH) during the etching process. Finally, in addition to or in combination with a chemical grinding process and/or a chemical etch, a physical etch, for example a reactive ion etch (RIE) process can be used to remove the illustrated portion of alternative engineered substrate 540. The physical etch process can smooth and prepare surfaces for subsequent metallization and other processes.

Figure 5F:
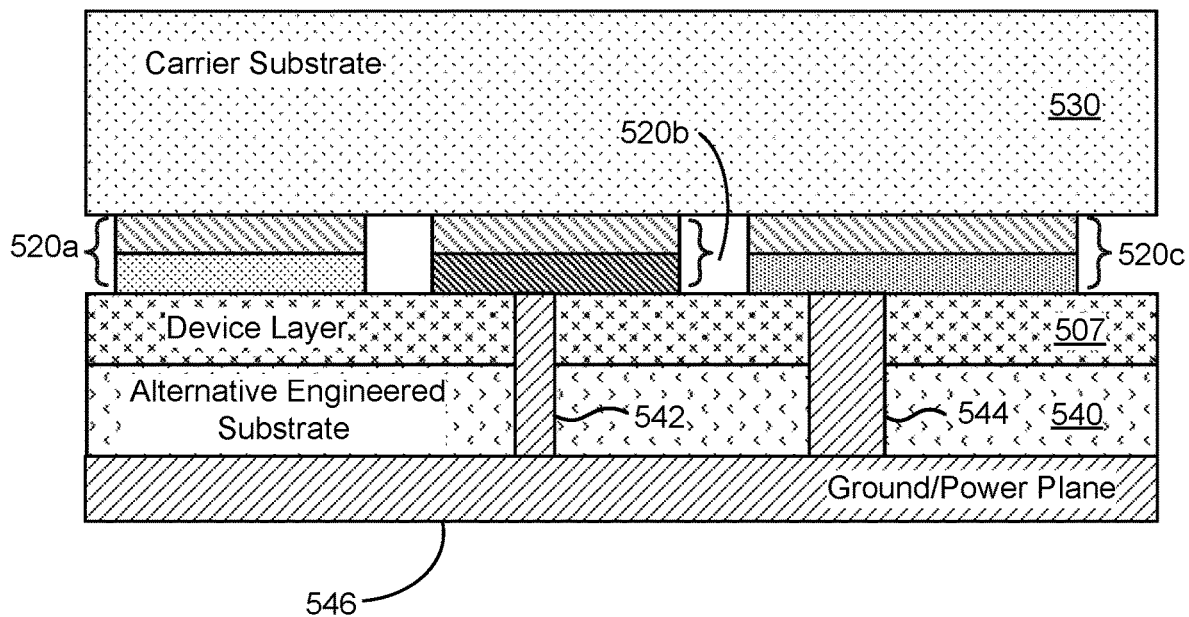
FIG. 5F is a cross-sectional view illustrating formation of vias in the remaining portion of the alternative engineered substrate according to an embodiment of the present invention.

FIG. 5F is a cross-sectional view illustrating formation of vias in the remaining portion of the alternative engineered substrate according to an embodiment of the present invention. In FIG. 5F, vias 542 and 544 are formed through the remaining portion of alternative engineered substrate 540 to make electrical contact with MMIC device element 520b and MMIC device element 520c, respectively. A ground/power plane 546 is formed and is electrically connected to vias 542 and 544. Vias 542 and 544 can be fabricated using appropriate semiconductor processing techniques, including etching, laser ablation, or the like. In some embodiments, combinations of methods can be utilized to terminate the via formation process once MMIC device element 520b and MMIC device element 520c have been accessed.

Although only two vias, via 542 and via 544 are illustrated in FIG. 5F, with no via formed to MMIC device element 520a, this is not required by the present invention. In other embodiments, vias can be formed to every MMIC device element or vias can be formed to a smaller subset of the MMIC device elements. As an example, if MMIC device element 520a is a capacitor, no via can be provided.

It should be noted that, although via formation is illustrated after alternative engineered substrate 540 has been thinned as illustrated in FIG. 5E, this is not required by the present invention and in other implementations, via formation can be performed prior to substrate thinning. One of ordinary skill in the art would recognize many variations, modifications, and alternatives.

Figure 5G:
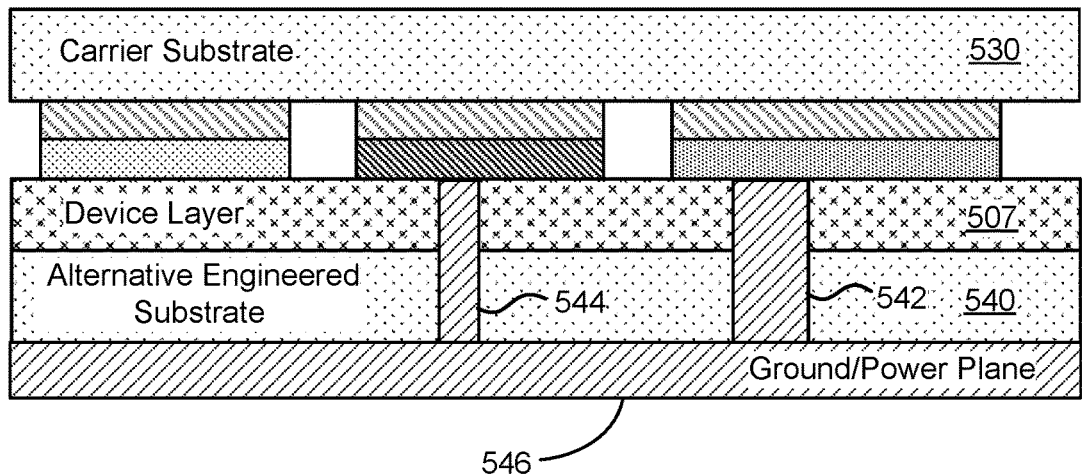
FIG. 5G is a cross-sectional view illustrating removal of a portion of the carrier substrate according to an embodiment of the present invention.

FIG. 5G is a cross-sectional view illustrating removal of a portion of the carrier substrate according to an embodiment of the present invention. As discussed in relation to FIG. 5E and alternative engineered substrate 540, carrier substrate 530 can be thinned to a reduced thickness, for example, to a thickness on the order of 50 μm. The thinning processes discussed in relation to FIGS. 3E and 5E can be utilized as appropriate.

Figure 5H:
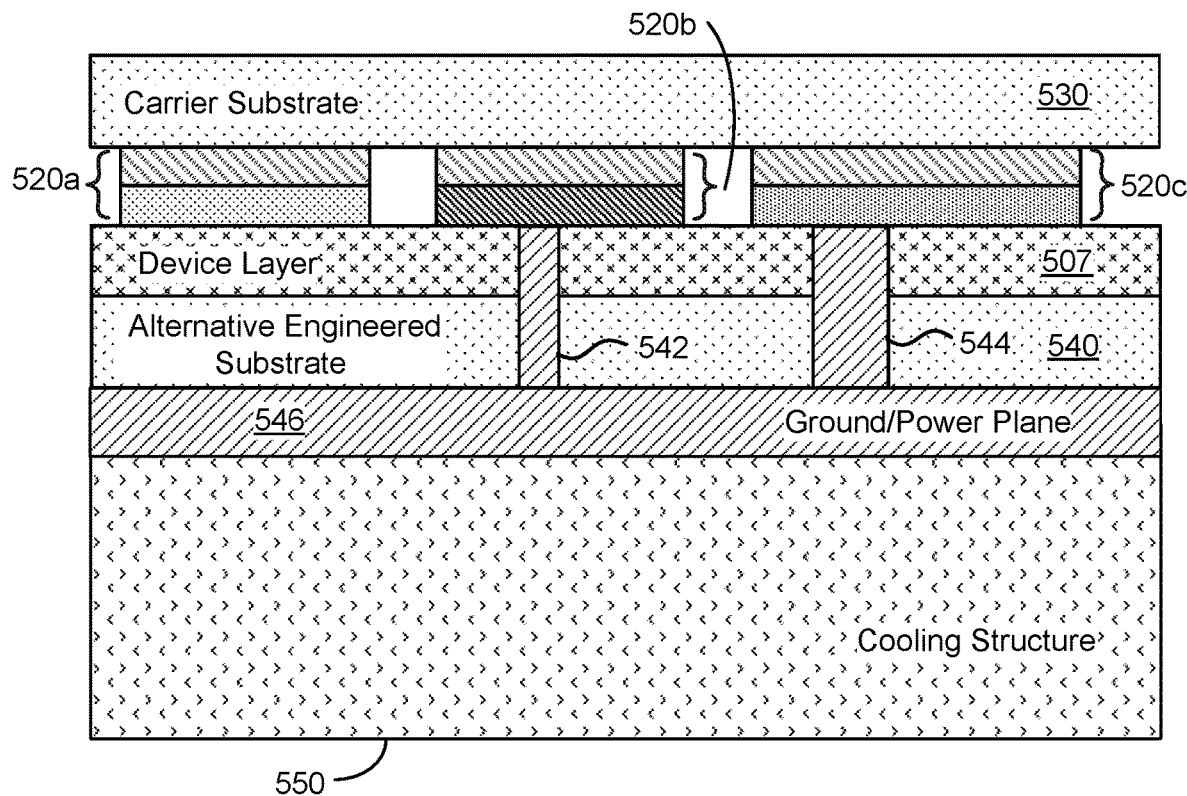
FIG. 5H is a cross-sectional view illustrating attachment of a cooling structure to the alternative engineered substrate according to an embodiment of the present invention.

FIG. 5H is a cross-sectional view illustrating attachment of a cooling structure to the alternative engineered substrate according to an embodiment of the present invention. Cooling structure 550 can be utilized to provide single sided cooling in a manner that decouples ground/power plane 546 from cooling structure 550. During device operation, heat generated by MMIC device elements 520 can be conducted through device layer 507, the remaining portion of alternative engineered substrate 540, and ground/power plane 546 to cooling structure 550.

FIG. SI is a simplified flowchart illustrating a method of fabricating a MMIC system according to an embodiment of the present invention. The method 560 includes providing an engineered substrate including a growth substrate and a device layer coupled to the growth substrate (570) and fabricating a plurality of MMIC device elements using the device layer (572). The method also includes providing a carrier substrate (574) and bonding the carrier substrate to the plurality of MMIC device elements (576). The coefficient of thermal expansion (CTE) of the alternative engineered substrate can substantially match a CTE of the device layer. The alternative engineered substrate can comprise a polycrystalline ceramic core, for example, aluminum nitride. The thickness of the device layer can be greater than 1 μm, for example, between 1 μm and 10 μm.

The method further includes removing the growth substrate (578), bonding an alternative engineered substrate to the device layer and removing a portion of the alternative engineered substrate (580). The method additionally includes forming a ground/power plane coupled to the alternative engineered substrate and forming a plurality of vias passing from the ground/power plane to one or more of the plurality of MMIC device elements (582). The method also includes joining a cooling structure to the ground/power plane (584). In some embodiments, the method can also include removing at least a portion of the carrier substrate. Additionally, in some implementations, the method includes forming a second ground/power plane coupled to a remaining portion of the carrier substrate and forming a second plurality of vias passing from the second ground/power plane to one or more of the plurality of MMIC device elements.

Figure 5I:
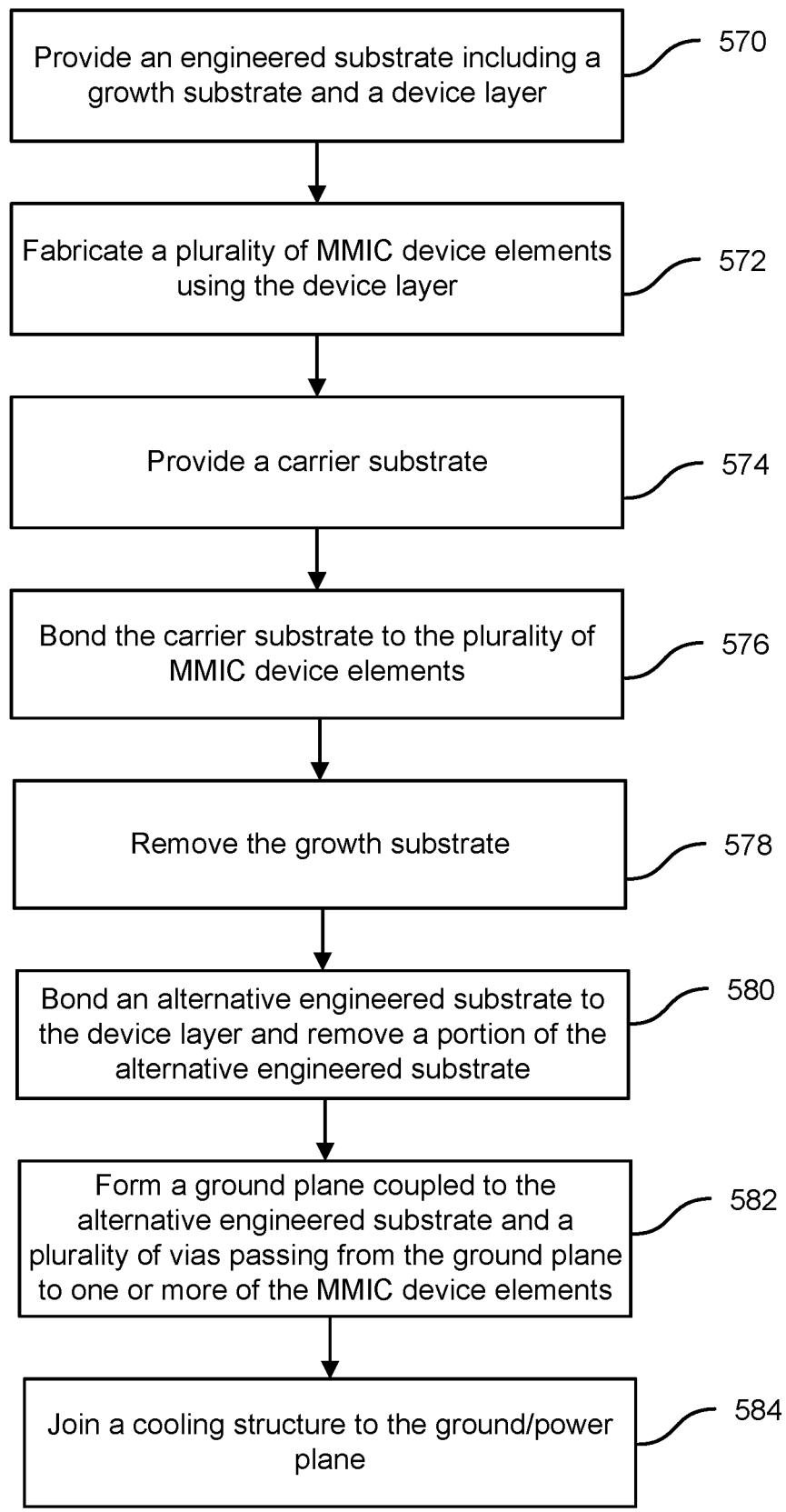
FIG. 5I is a simplified flowchart illustrating a method of fabricating a MMIC system according to an embodiment of the present invention.

It should be appreciated that the specific steps illustrated in FIG. 5I provide a particular method of fabricating a MMIC system according to an embodiment of the present invention. Other sequences of steps may also be performed according to alternative embodiments. For example, alternative embodiments of the present invention may perform the steps outlined above in a different order. Moreover, the individual steps illustrated in FIG. 5I may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
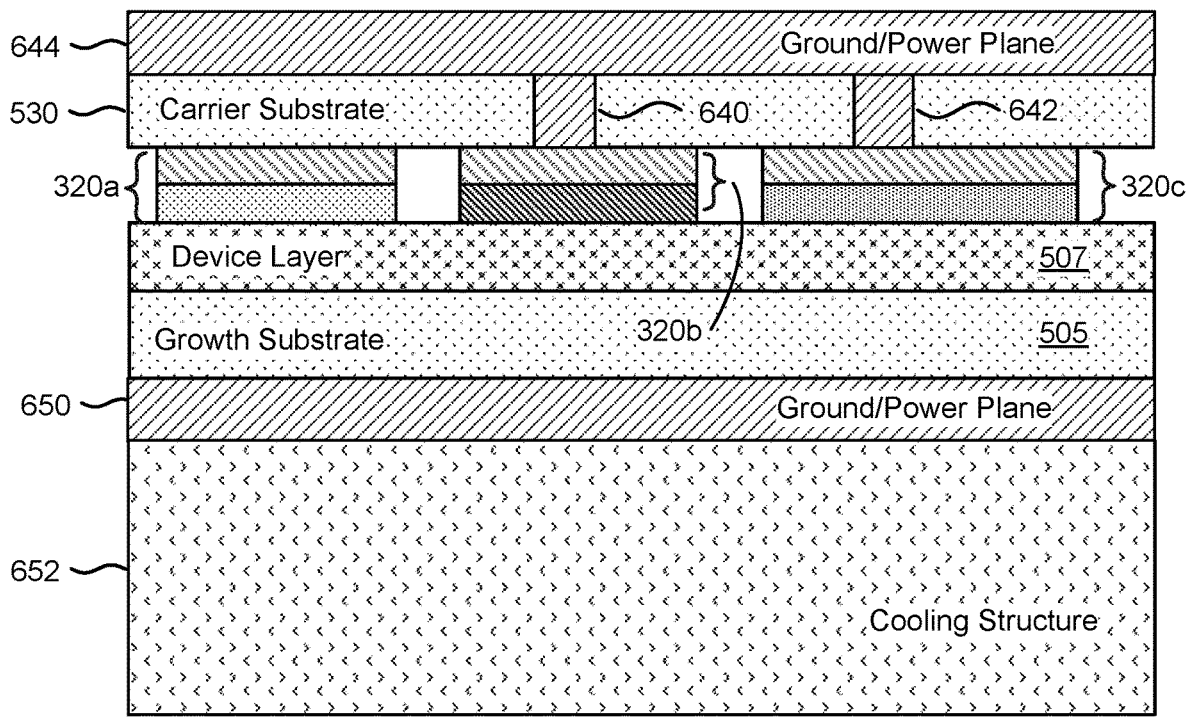
FIG. 6 is a cross-sectional view illustrating an alternative embodiment utilizing dual-sided ground/power planes according to an embodiment of the present invention.

FIG. 6 is a cross-sectional view illustrating an alternative embodiment utilizing dual-sided ground/power planes according to an embodiment of the present invention. In FIG. 6, vias 640 and 642 are formed through the remaining portion of carrier substrate 530 to make electrical contact with MMIC device element 520b and MMIC device element 520c, respectively. A ground/power plane 644 is formed and is electrically connected to vias 640 and 642. Vias 640 and 642 can be fabricated using appropriate semiconductor processing techniques, including etching, laser ablation, or the like. In some embodiments, combinations of methods can be utilized to terminate the via formation process once MMIC device element 520b and MMIC device element 520c have been accessed. Ground/power plane 650 and cooling structure 652 are utilized as discussed in relation to FIG. 5H.

Although only two vias, via 640 and via 642, are illustrated in FIG. 6, with no via formed to MMIC device element 520a, this is not required by the present invention. In other embodiments, vias can be formed to every MMIC device element or vias can be formed to a smaller subset of the MMIC device elements. As an example, if MMIC device element 520a is a capacitor, no via can be provided.

Figure 7A:
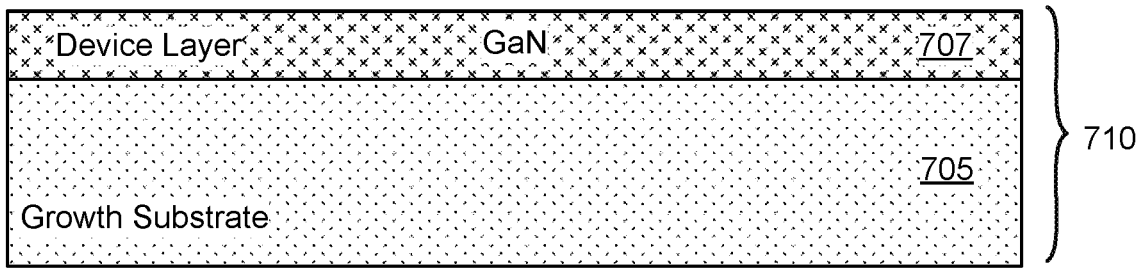
FIG. 7A is a cross-sectional view of an engineered substrate with a device layer according to an embodiment of the present invention.

FIG. 7A is a cross-sectional view of an engineered substrate with a device layer according to an embodiment of the present invention. In FIG. 7A, engineered substrate 710 includes a growth substrate 705 and a device layer 707 represented by a GaN layer in the illustrated embodiment. Growth substrate 705 and device layer 707 can be implemented using engineered substrate 100 as illustrated in FIG. 1, with device layer 707 corresponding to GaN epitaxial layer 130. Device layer 707 is utilized in the fabrication of MMIC device elements as described more fully below.

Figure 7B:
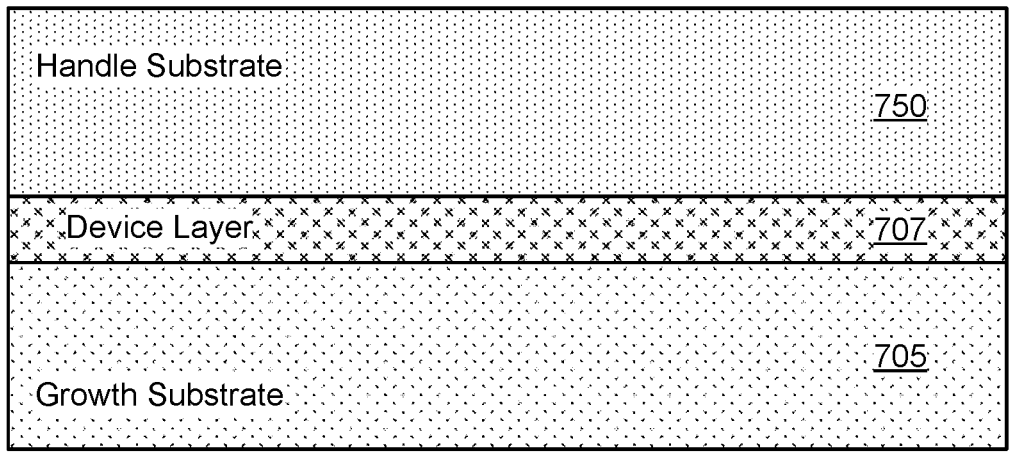
FIG. 7B is a cross-sectional view illustrating bonding of a handle substrate to the device layer according to an embodiment of the present invention.

FIG. 7B is a cross-sectional view illustrating bonding of a handle substrate to the device layer according to an embodiment of the present invention. In some embodiments, handle substrate 750 is implemented as a silicon substrate, a sapphire substrate, or the like. Handle substrate 750 is characterized by mechanical rigidity and the ability to be removed at a later stage of fabrication. In contrast with some of the other substrates discussed and utilized in the embodiments described herein, handle substrate 750 is removed before the final processing steps. Therefore, useful characteristics discussed with respect to other substrates, for example, CTE matching and compatibility with low loss, and high frequency operation, are not required for handle substrate 750.

In some embodiments, handle substrate 750 is bonded to device layer 707 using wafer bonding techniques including metal-to-metal bonding by providing a matching metal pattern on the handle substrate, or by oxide-to-oxide bonding by coating both wafers using, for example, $SiO_2$. In some embodiments, the bonding surface of handle substrate 750 can be coated with an adhesion promoter to promote the strength of the bond.

Figure 7C:
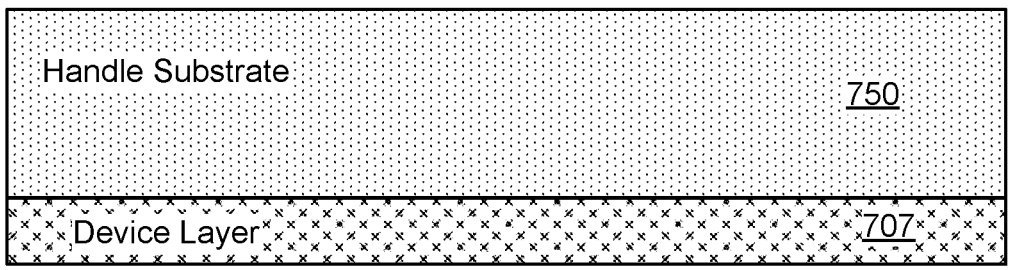
FIG. 7C is a cross-sectional view illustrating removal of the growth substrate according to an embodiment of the present invention.

FIG. 7C is a cross-sectional view illustrating removal of the growth substrate according to an embodiment of the present invention. As illustrated in FIG. 7C, growth substrate 705 is removed to expose device layer 707.

A variety of techniques can be used to remove growth substrate 705, leaving device layer 507 bonded to handle substrate 750. As an example, a chemical mechanical polishing (CMP) process can be used to remove growth substrate 705, terminating at or in device layer 707. In other embodiments, a CMP process is used to remove a portion of growth substrate 705 and then chemical and/or physical etch processes are utilized to remove the remainder of growth substrate 705. Alternatively, a chemical etch, which can be a selective etch, can be used to remove a portion of or all of growth substrate 705. The chemical etch may be selective to terminate at a layer of interest, for example device layer 707. Finally, a physical etch, for example a reactive ion etch (RIE) process, can be used to remove a portion or all of growth substrate 705 and/or to smooth and prepare device layer 707 for subsequent bonding and processing steps.

The removal of growth substrate 705 enables structures to be removed that would otherwise result in loss during operation of the MMIC devices that will subsequently be fabricated in device layer 707. As an example, engineered substrate 100 illustrated in FIG. 1 includes conductive layer 114, which can be a polysilicon layer doped to provide a highly conductive material. During high frequency operation, electric and/or magnetic fields generated by the MMIC devices may interact with such a conductive layer, resulting in losses, heat generation, and other undesirable effects. Accordingly, by removing growth substrate 705 and layers/structures in growth substrate 705 that would adversely impact MMIC device performance, embodiments of the present invention provide methods and systems that have lower losses than comparable conventional devices and structures.

As an example, device layer 707 could include buffer layers and other layers utilized during initial epitaxial growth, for example, epitaxial growth of GaN materials. These layers, including buffer layers, could, in a manner similar to a conductive layer, impair MMIC device performance, for instance, by introducing loss. Accordingly, as illustrated in FIG. 7C, these layers can be removed along with growth substrate 705. One of ordinary skill in the art would recognize many variations, modifications, and alternatives.

Figure 7D:
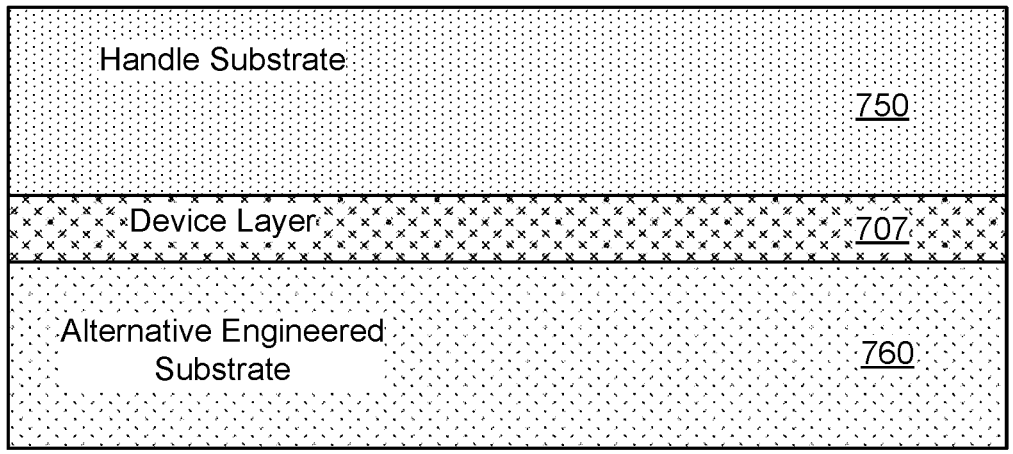
FIG. 7D is a cross-sectional view illustrating bonding of an alternative engineered substrate to the device layer according to an embodiment of the present invention.

FIG. 7D is a cross-sectional view illustrating bonding of an alternative engineered substrate to the device layer according to an embodiment of the present invention. In some embodiments, alternative engineered substrate 760 is implemented as the alternative engineered substrate 200 illustrated in FIG. 2. Use of alternative engineered substrate 760 similar to alternative engineered substrate 200 provides a core for the alternative engineered substrate, for example, polycrystalline AlN, that will have a CTE that is substantially matched to epitaxial materials present in other elements in the MMIC device structures, which can be beneficial during semiconductor processing operations. Additionally, as discussed in relation to the removal of growth substrate 705, alternative engineered substrate 760 can be fabricated using materials that are compatible with low loss, high frequency operation. As an example, alternative engineered substrate 760 can be substantially free of silicon, which could adversely impact MMIC device performance.

As an example, comparing alternative engineered substrate 760 bonded to device layer 707 to a silicon substrate with a epitaxial grown GaN layer on the silicon substrate, MMIC devices fabricated in device layer 707 bonded to alternative engineered substrate 760 will be characterized by low losses on account of the characteristics of alternative engineered substrate 760. In contrast, if alternative engineered substrate 760 were replaced with a silicon substrate, MMIC devices fabricated in device layer 707 would be characterized by higher losses resulting from interaction between electric and magnetic fields and the silicon substrate, which can include interface losses.

In some embodiments, alternative engineered substrate 760 is bonded to device layer 707 using wafer bonding techniques including metal-to-metal bonding by providing a matching metal pattern on the alternative engineered substrate, or by oxide-to-oxide bonding by coating both wafers using, for example, $SiO_2$. In some embodiments, the bonding surface of alternative engineered substrate 760 can be coated with an adhesion promoter to promote the strength of the bond.

Figure 7E:
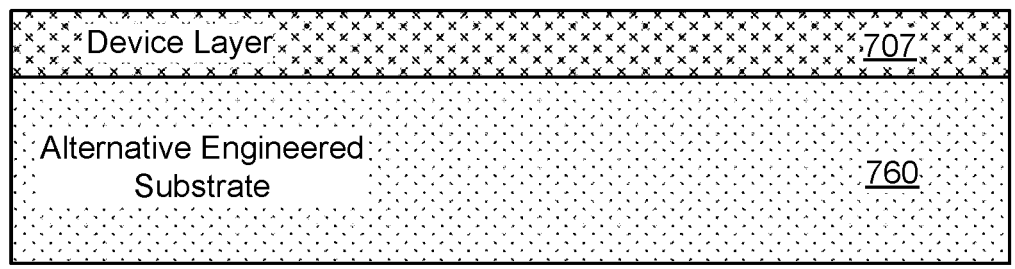
FIG. 7E is a cross-sectional view illustrating removal of the handle substrate according to an embodiment of the present invention.

FIG. 7E is a cross-sectional view illustrating removal of the handle substrate according to an embodiment of the present invention. In order to expose device layer 707, which is then used in subsequent MMIC device fabrication processes, handle substrate 750 is removed as illustrated in FIG. 7E.

A variety of techniques can be used to remove handle substrate 750, leaving device layer 707 bonded to alternative engineered substrate 760. As an example, a chemical mechanical polishing (CMP) process can be used to remove handle substrate 750, terminating at or in device layer 707. In other embodiments, a CMP process is used to remove a portion of handle substrate 750 and then chemical and/or physical etch processes are utilized to remove the remainder of handle substrate 750. Alternatively, a chemical etch, which can be a selective etch, can be used to remove a portion of or all of handle substrate 750. The chemical etch may be selective to terminate at a layer of interest, for example device layer 707. Finally, a physical etch, for example a reactive ion etch (RIE) process, can be used to remove a portion or all of handle substrate 750 and/or to smooth and prepare device layer 707 for a subsequent epitaxial growth and/or processing steps.

The removal of handle substrate 750 can be performed in several manners. As an example, a mechanical grinding process can be used to remove the majority of the handle substrate. Then, a chemical etch, which can be a selective etch, can be used to remove materials and expose a layer of interest. Finally, a physical etch, for example a reactive ion etch (ME) process, can be used to remove interfacial layers that may be present.

The removal of handle substrate 750 enables structures to be removed that would otherwise result in loss during operation of the MMIC devices. As an example, handle substrate 750 may include a conductive layer that may interact, during high frequency operation, with electric and/or magnetic fields generated by the MMIC devices, resulting in losses, heat generation, and other undesirable effects. Accordingly, by removing handle substrate 750 and layers/structures in handle substrate 750 that would adversely impact MMIC device performance, embodiments of the present invention provide methods and systems that have lower losses than comparable conventional devices and structures.

Referring to alternative engineered substrate 760 and device layer 707 illustrated in FIG. 7E, a substrate structure is provided that can be utilized in a MMIC production line as described more fully below. Alternative engineered substrate 760 can be provided at large sizes, for example, 200 mm or 300 mm, which are suitable for MMIC production lines. Moreover, because alternative engineered substrate 760 can include a barrier layer that can prevent out-diffusion from ceramic materials, including polycrystalline AlN, the substrate structure can be utilized in semiconductor process flows and clean room environments. Additionally, because the alternative engineered substrate 760 can be CTE matched to subsequently grown epitaxial layers, alternative engineered substrate provides benefits available using growth substrate 705, but does not include structures or materials that would cause adverse impacts on MMIC device performance.

Figure 7F:
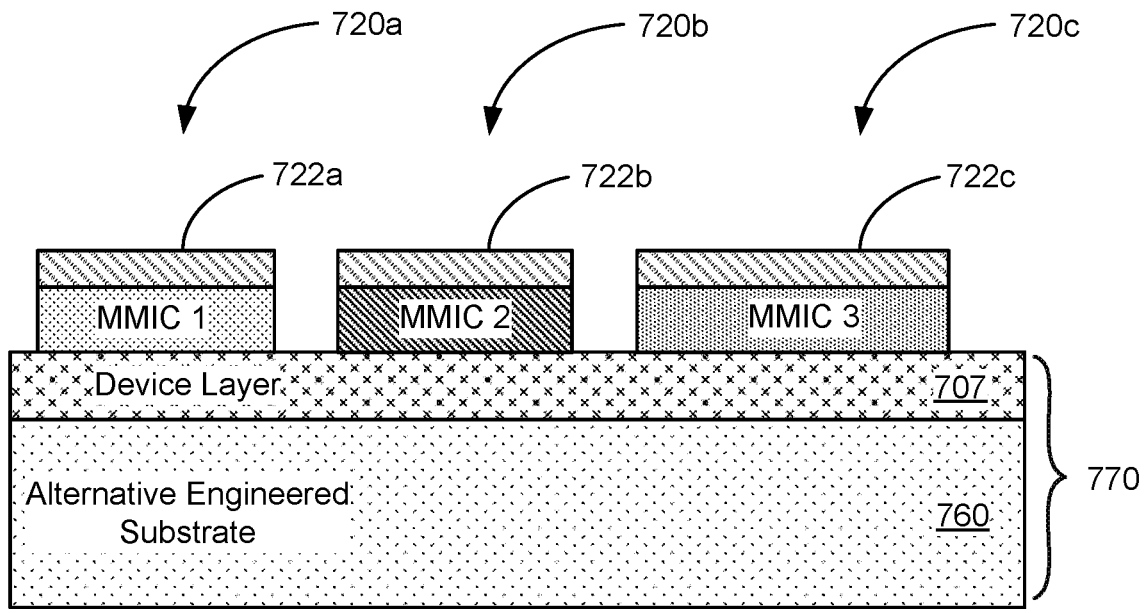
FIG. 7F is a cross-sectional view illustrating formation of MMIC device elements in the device layer according to an embodiment of the present invention.

FIG. 7F is a cross-sectional view illustrating formation of MMIC device elements in the device layer according to an embodiment of the present invention. In FIG. 7F, substrate structure 770 includes alternative engineered substrate 760 and device layer 707, which is a GaN layer in the illustrated embodiment. Device layer 707 is utilized in the fabrication of MMIC device elements 720a, 720b, and 720c. Each of the MMIC device elements 720 represents a different MMIC device; for example, MMIC device element 720a can be a capacitor, MMIC device element 720b can be a transistor, and MMIC device element 720b can be a waveguide. Each of the different MMIC device elements 720 includes a metal structure 722. In FIG. 7F device layer 707 is a GaN layer, can be on the order of 1 to 10 µm in thickness, and is utilized in order to reduce the loss and the capacitance.

As illustrated in FIG. 7F and in contrast with the process flow associated with FIG. 3A, device fabrication is performed after device layer 707 has been bonded to alternative engineered substrate 760. As a result, alternative engineered substrate 760 can be selected to provide low loss during high frequency operation of the MMIC devices as discussed above. Additionally, characteristics of alternative engineered substrate 760 can be selected to provide compliance with foundry processes. Moreover, use of alternative engineered substrate 760 enables the use of substrates during the MMIC device fabrication process that would not otherwise be available. For example, using alternative engineered substrate 200 illustrated in FIG. 2 as alternative engineered substrate 760, device layer 707 can have a diameter of 200 mm, 300 mm, or the like. Using a 200 mm GaN layer as device layer 707 bonded to alternative engineered substrate 760, foundry processes appropriate for a 200 mm wafer can be used. In contrast, if device layer 707 were grown on a silicon carbide substrate, size limitations would prevent the use of device layers with these large diameters.

Figure 7G:
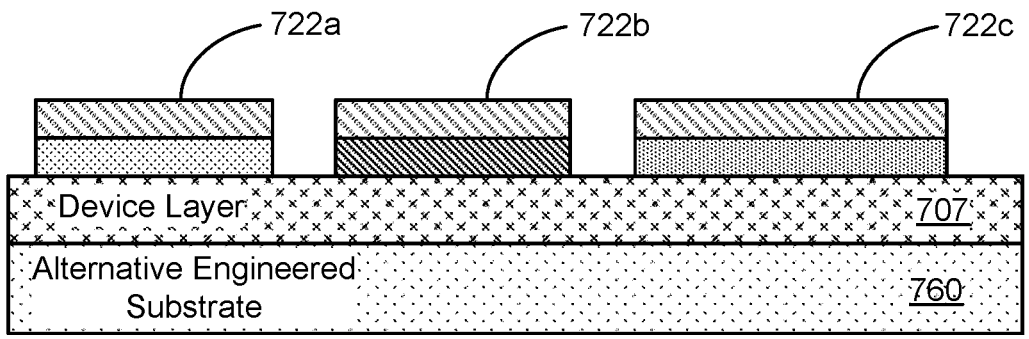
FIG. 7G is a cross-sectional view illustrating removal of a portion of the alternative engineered substrate according to an embodiment of the present invention.

FIG. 7G is a cross-sectional view illustrating removal of a portion of the alternative engineered substrate according to an embodiment of the present invention. As discussed in relation to FIG. 3E, in order to reduce thermal resistance, alternative engineered substrate 760 is thinned to a reduced thickness, for example, to a thickness on the order of 50 µm.

The substrate thinning process illustrated in FIG. 7G can be performed in several manners. As an example, a mechanical grinding process can be used to remove a portion of alternative engineered substrate 760. Alternatively, or in combination with a mechanical grinding process, a chemical etch, which can be a selective etch, can be used to remove the illustrated portion of alternative engineered substrate 760. As an example, the chemical etch may utilize potassium hydroxide (KOH) or tetramethylammonium hydroxide (TMAH) during the etching process. Finally, in addition to or in combination with a mechanical grinding process and/or a chemical etch, a physical etch, for example a reactive ion etch (RIE) process can be used to remove the illustrated portion of alternative engineered substrate 760. The physical etch process can smooth and prepare surfaces for subsequent metallization and other processes.

In contrast with techniques that would remove a portion of other types of substrates, thinned alternative engineered substrate 760 as illustrated in FIG. 7G provides mechanical stability for device layer 707 and the MMIC device elements. This mechanical stability results from the low levels of residual stress associated with device layer 707 that is bonded to alternative engineered substrate 760. If, for example, device layer 707 were grown on a silicon substrate, residual stresses present in device layer 707 would result in warping and/or bowing of the silicon substrate after the thinning process illustrated in FIG. 7G. In contrast, since device layer 707 was CTE matched to growth substrate 705, residual stresses present in device layer 707 are low, enabling a high level of mechanical stability after the thinning process illustrated in FIG. 7G.

Figure 7H:
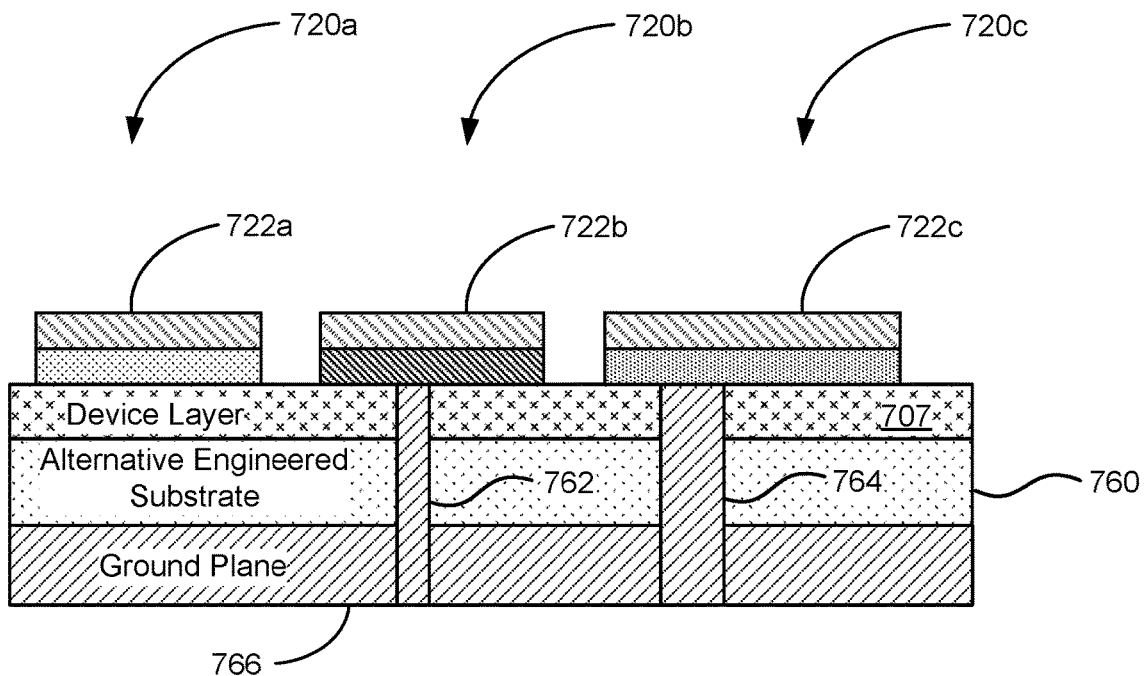
FIG. 7H is a cross-sectional view illustrating formation of vias in the remaining portion of the alternative engineered substrate according to an embodiment of the present invention.

FIG. 7H is a cross-sectional view illustrating formation of vias in the remaining portion of the alternative engineered substrate according to an embodiment of the present invention. In FIG. 7H, vias 762 and 764 are formed through the remaining portion of alternative engineered substrate 760 to make electrical contact with MMIC device element 720b and MMIC device element 720c, respectively. A ground/power plane 766 is formed and is electrically connected to vias 762 and 764. Vias 762 and 764 can be fabricated using appropriate semiconductor processing techniques, including etching, laser ablation, or the like. In some embodiments, combinations of methods can be utilized to terminate the via formation process once MMIC device element 720b and MMIC device element 720c have been accessed.

Although only two vias, via 762 and via 764, are illustrated in FIG. 7H, with no via formed to MMIC device element 720a, this is not required by the present invention. In other embodiments, vias can be formed to every MMIC device element or vias can be formed to a smaller subset of the MMIC device elements. As an example, if MMIC device element 720a is a capacitor, no via can be provided.

Figure 7I:
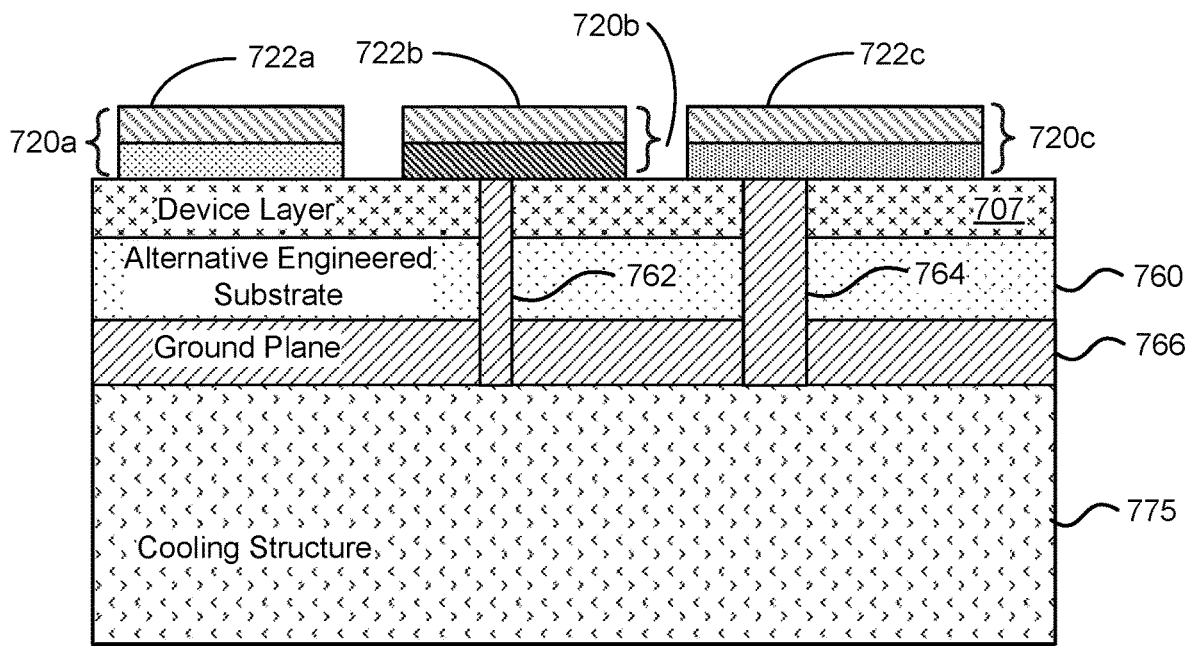
FIG. 7I is a cross-sectional view illustrating attachment of a cooling structure to the alternative engineered substrate according to an embodiment of the present invention.

FIG. 7I is a cross-sectional view illustrating attachment of a cooling structure to the alternative engineered substrate according to an embodiment of the present invention. Cooling structure 775 is attached to ground/power plane 766 and during device operation, heat generated by MMIC device elements 720 can be conducted through device layer 707, the remaining portion of alternative engineered substrate 760, and ground/power plane 766 to cooling structure 775.

Figure 7J:
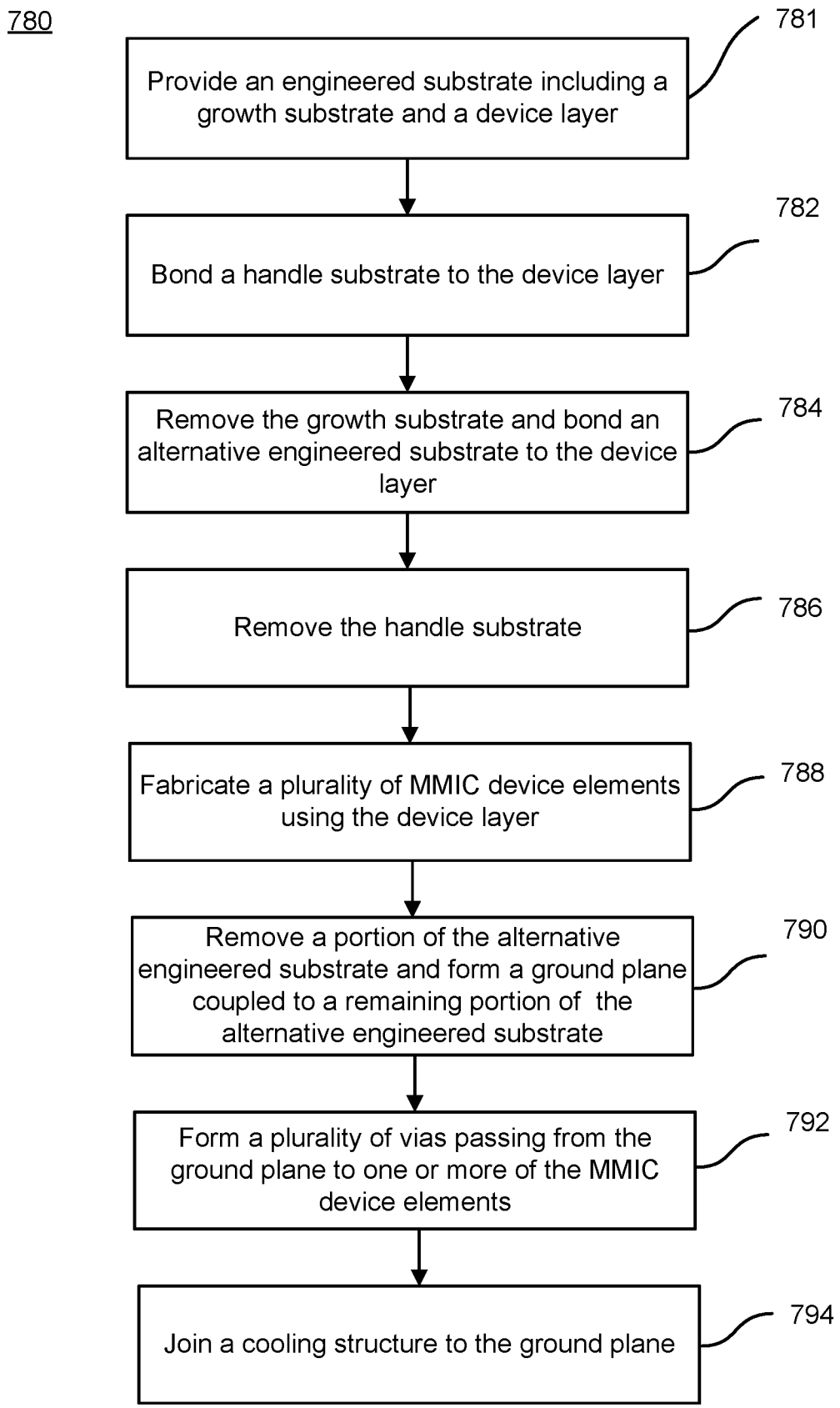
FIG. 7J is a simplified flowchart illustrating a method of fabricating a MMIC system according to an embodiment of the present invention.

FIG. 7J is a simplified flowchart illustrating a method of fabricating a MMIC system according to an embodiment of the present invention. The method 780 includes providing an engineered substrate including a growth substrate and a device layer coupled to the growth substrate (781) and bonding a handle substrate to the device layer (782). The method also includes removing the growth substrate and bonding an alternative engineered substrate to the device layer (784). The method further includes removing the handle substrate (786) and fabricating a plurality of MMIC device elements using the device layer (788).

Additionally, the method includes removing a portion of the alternative engineered substrate and forming a ground/power plane coupled to a remaining portion of the alternative engineered substrate (790). The method also includes forming a plurality of vias passing from the ground/power plane to one or more of the plurality of MMIC device elements (792) and joining a cooling structure to the ground/power plane (794). Since the structure fabricated using the method described in relation to FIG. 7J shares common elements with the structures fabricated using the methods described in relation to FIGS. 3H and 5I, steps utilized in conjunction with FIGS. 3H and 5I are applicable to FIG. 7J as appropriate.

It should be appreciated that the specific steps illustrated in FIG. 7J provide a particular method of fabricating a MMIC system according to an embodiment of the present invention. Other sequences of steps may also be performed according to alternative embodiments. For example, alternative embodiments of the present invention may perform the steps outlined above in a different order. Moreover, the individual steps illustrated in FIG. 7J may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8A:
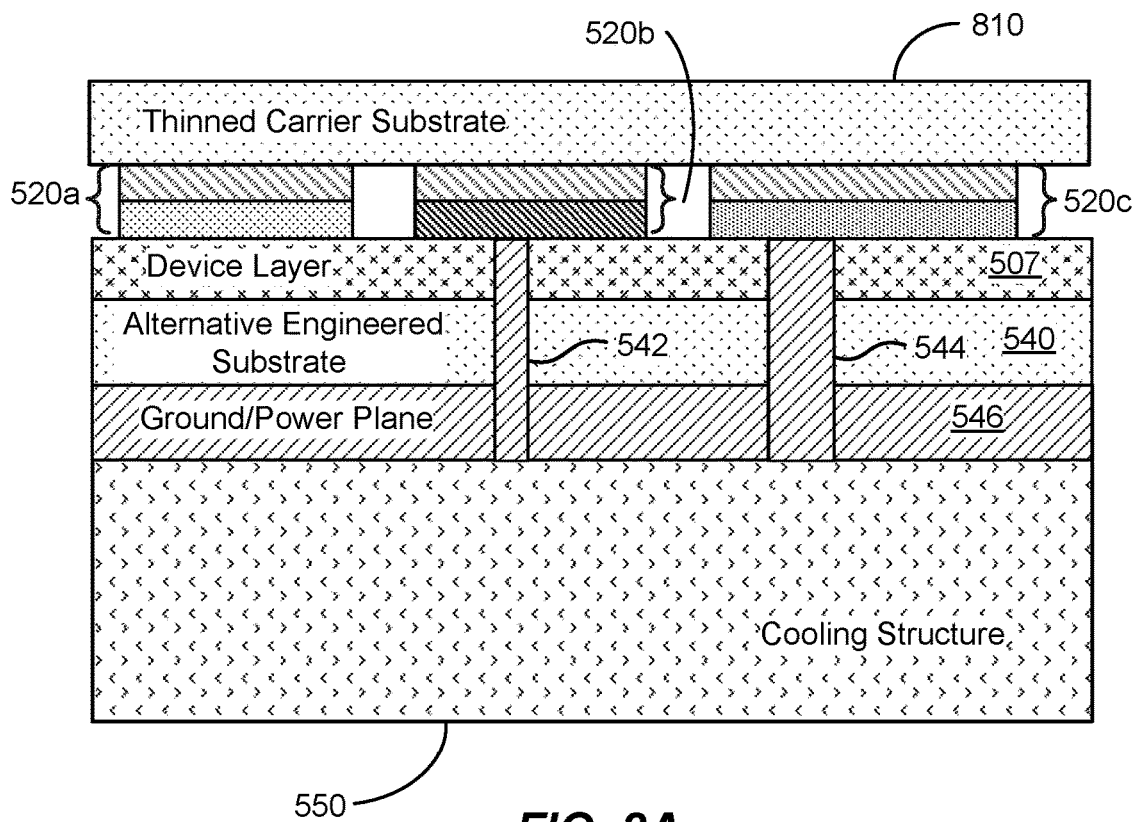
FIG. 8A is a cross-sectional view illustrating an alternative embodiment utilizing a thinned carrier substrate according to an embodiment of the present invention.

FIG. 8A is a cross-sectional view illustrating an alternative embodiment utilizing a thinned carrier substrate according to an embodiment of the present invention. FIG. 8A provides a structure corresponding to that shown in FIG. 5H, which can be utilized in conjunction with formation of vias passing through the thinned carrier substrate to provide electrical contact to MMIC device elements.

Figure 8B:
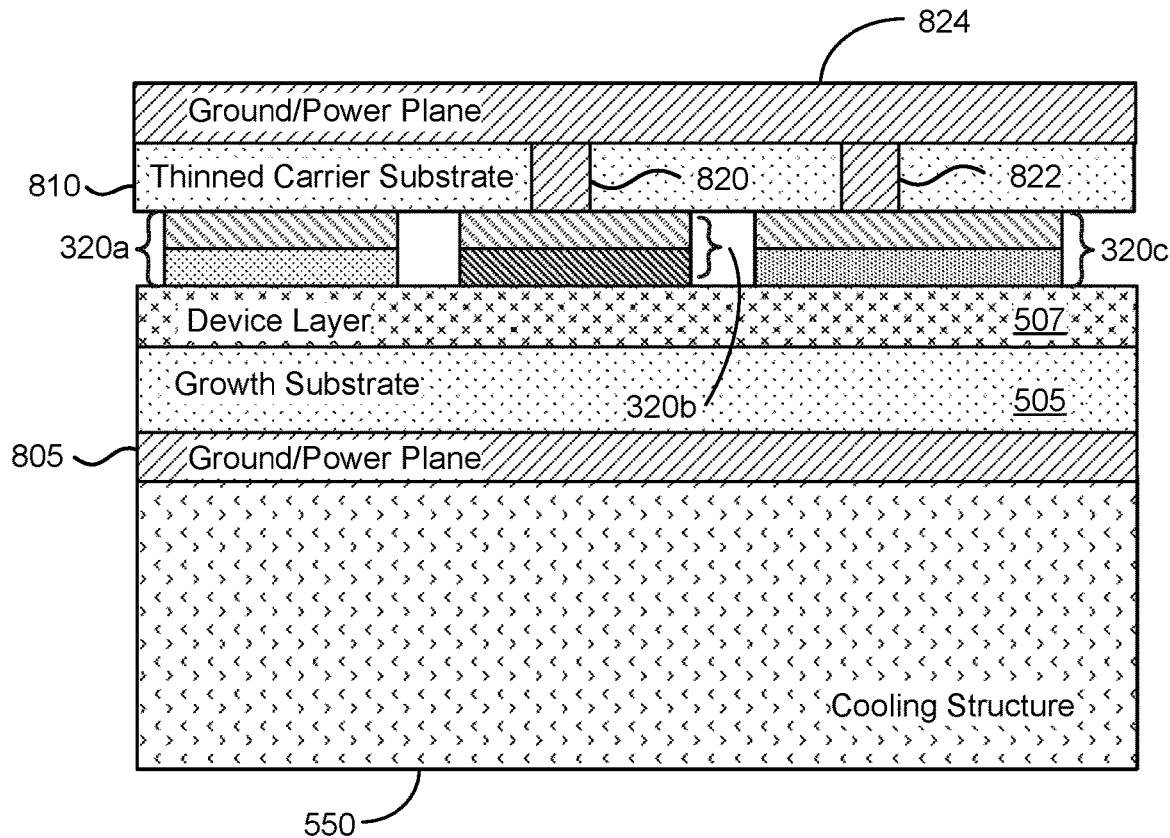
FIG. 8B is a cross-sectional view illustrating a second alternative embodiment utilizing dual-sided ground/power planes according to an embodiment of the present invention.

FIG. 8B is a cross-sectional view illustrating a second alternative embodiment utilizing dual-sided ground/power planes according to an embodiment of the present invention. In a manner similar to that discussed in relation to FIG. 6, dual-sided ground/power planes are implemented in FIG. 8B. Vias 820 and 822 are formed through the thinned carrier substrate 810 to make electrical contact with MMIC device elements. A ground/power plane 824 is formed and is electrically connected to vias 820 and 822. Vias 820 and 822 can be fabricated using appropriate semiconductor processing techniques, including etching, laser ablation, or the like. In some embodiments, combinations of methods can be utilized to terminate the via formation process once the MMIC device elements have been accessed. A second ground/power plane 805 is coupled to cooling structure 550.

Although only two vias, via 820 and via 822, are illustrated in FIG. 8B, with no via formed to at least one of the MMIC device elements, this is not required by the present invention. In other embodiments, vias can be formed to every MMIC device element or vias can be formed to a smaller subset of the MMIC device elements.

Although some embodiments have been discussed in terms of a layer, the term layer should be understood such that a layer can include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A monolithic microwave integrated circuit (MMIC) system comprising:
   a growth substrate;
   a semiconductor device layer coupled to the growth substrate;
   a plurality of MMIC device elements at least partially disposed in the semiconductor device layer;
   a plurality of metallization structures, wherein each of the plurality of metallization structures is electrically coupled to one of the plurality of MMIC device elements;
   a carrier substrate coupled to the plurality of metallization structures; and
   a cooling structure coupled to the carrier substrate, wherein the carrier substrate is disposed between the plurality of metallization structures and the cooling structure.

2. The MMIC system of claim 1 wherein a coefficient of thermal expansion (CTE) of the growth substrate substantially matches a CTE of the semiconductor device layer.

3. The MMIC system of claim 1 wherein the growth substrate comprises a polycrystalline ceramic core.

4. The MMIC system of claim 3 wherein the polycrystalline ceramic core comprises aluminum nitride.

5. The MMIC system of claim 1 wherein a thickness of the semiconductor device layer is greater than 1 μm.

6. The MMIC system of claim 5 wherein the thickness is between 1 and 10 μm.

7. The MMIC system of claim 1 further comprising a plurality of vias connecting a ground/power plane to the plurality of MMIC device elements.

8. The MMIC system of claim 7 further comprising a second cooling structure coupled to the ground/power plane.

9. The MMIC system of claim 1 further comprising:
   a second ground/power plane coupled to the carrier substrate; and
   a second plurality of vias passing from the second ground/power plane to one or more of the plurality of metallic structures.

10. The MMIC system of claim 9 further comprising a second cooling structure coupled to the second ground/power plane.

11. The MMIC system of claim 1 wherein the semiconductor device layer comprises an epitaxial gallium nitride (GaN) layer.

12. The MMIC system of claim 1 wherein the plurality of metallization structures are disposed between the plurality of MMIC device elements and the carrier substrate.

13. The MMIC system of claim 1 wherein each of the plurality of MMIC device elements includes a corresponding metal structure and each of the plurality of metallization structures is joined to one of the corresponding metal structures.

14. The MMIC system of claim 1 wherein the plurality of metallization structures are directly connected to the plurality of MMIC device elements.

15. The MMIC system of claim 1 wherein the carrier substrate is directly connected to the plurality of metallization structures.

16. The MMIC system of claim 1 wherein the plurality of MMIC device elements are disposed between the semiconductor device layer and the plurality of metallization structures.

* * * * *